(12) United States Patent
Tiwari

(10) Patent No.: US 10,147,467 B2
(45) Date of Patent: Dec. 4, 2018

(54) ELEMENT VALUE COMPARISON IN MEMORY

(71) Applicant: Micron Technology, Inc., Boise, ID (US)

(72) Inventor: Sanjay Tiwari, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/489,342

(22) Filed: Apr. 17, 2017

(65) Prior Publication Data

US 2018/0301173 A1    Oct. 18, 2018

(51) Int. Cl.
*G11C 7/06* (2006.01)
*G11C 7/10* (2006.01)

(52) U.S. Cl.
CPC .............. *G11C 7/062* (2013.01); *G11C 7/065* (2013.01); *G11C 7/1006* (2013.01)

(58) Field of Classification Search
CPC .................................................. G11C 7/1006
USPC ................................................... 365/189.07
See application file for complete search history.

(56) References Cited

U.S. PATENT DOCUMENTS

| | | |
|---|---|---|
| 4,380,046 A | 4/1983 | Fung |
| 4,435,792 A | 3/1984 | Bechtolsheim |
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffman et al. |

(Continued)

FOREIGN PATENT DOCUMENTS

| | | |
|---|---|---|
| CN | 102141905 | 8/2011 |
| EP | 0214718 | 3/1987 |

(Continued)

OTHER PUBLICATIONS

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

(Continued)

*Primary Examiner* — Son Mai
(74) *Attorney, Agent, or Firm* — Brooks, Cameron & Huebsch, PLLC

(57) ABSTRACT

The present disclosure includes apparatuses and methods related to performing a greater vector determination in memory. An example apparatus comprises a first group of memory cells coupled to a sense line and to a number of first access lines and a second group of memory cells coupled to the sense line and to a number of second access lines. The example apparatus comprises a controller configured to operate sensing circuitry to compare a value of a first element stored in the first group of memory cells to a value of a second element stored in the second group of memory cells to determine which of the value of the first element and the value of the second element is greater.

21 Claims, 14 Drawing Sheets

(56) References Cited

U.S. PATENT DOCUMENTS

| | | |
|---|---|---|
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,430,687 A | 7/1995 | Hung et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,953,738 A | 9/1999 | Rao |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,058,880 B1 | 6/2006 | Ding et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,532,529 B2 | 5/2009 | Dadashev et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,341,362 B2 * | 12/2012 | Akerib ............... G11C 7/1006 711/108 |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,683,183 B2 | 3/2014 | Sprangle |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,235,414 B2 | 1/2016 | Gopal et al. |
| 2001/0007112 A1 | 7/2001 | Porterfield |

(56) References Cited

U.S. PATENT DOCUMENTS

| | | |
|---|---|---|
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0196030 A1 | 10/2003 | Elliott et al. |
| 2003/0222879 A1 | 12/2003 | Rong et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Penner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0142419 A1 | 6/2011 | Zou et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0247673 A1 | 9/2014 | Muralimanohar et al. |
| 2014/0250279 A1 | 9/2014 | Manning |
| 2014/0281371 A1 | 9/2014 | Thantry et al. |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0089166 A1 | 3/2015 | Kogge |
| 2015/0120987 A1* | 4/2015 | Wheeler ............ G11C 7/1006 711/102 |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |
| 2016/0110135 A1 | 4/2016 | Wheeler et al. |
| 2016/0125919 A1 | 5/2016 | Hush |
| 2016/0154596 A1 | 6/2016 | Willcock et al. |
| 2016/0155482 A1 | 6/2016 | La Fratta |
| 2016/0188250 A1 | 6/2016 | Wheeler |
| 2016/0196142 A1 | 7/2016 | Wheeler et al. |
| 2016/0196856 A1 | 7/2016 | Tiwari et al. |
| 2016/0225422 A1 | 8/2016 | Tiwari et al. |
| 2016/0266873 A1 | 9/2016 | Tiwari et al. |
| 2016/0266899 A1 | 9/2016 | Tiwari |
| 2016/0267951 A1 | 9/2016 | Tiwari |
| 2016/0292080 A1 | 10/2016 | Leidel et al. |
| 2016/0306584 A1 | 10/2016 | Zawodny et al. |
| 2016/0306614 A1 | 10/2016 | Leidel et al. |
| 2016/0365129 A1 | 12/2016 | Willcock |
| 2016/0371033 A1 | 12/2016 | La Fratta et al. |
| 2017/0052906 A1 | 2/2017 | Lea |

FOREIGN PATENT DOCUMENTS

| | | |
|---|---|---|
| EP | 2026209 | 2/2009 |
| JP | H0831168 | 2/1996 |

(56) References Cited

FOREIGN PATENT DOCUMENTS

| JP | 2009259193 | 3/2015 |
|---|---|---|
| KR | 10-0211482 | 8/1998 |
| KR | 100821616 | 4/2008 |
| KR | 10-2010-0134235 | 12/2010 |
| KR | 10-2013-0049421 | 5/2013 |
| TW | 485601 | 5/2002 |
| TW | 200532708 | 10/2005 |
| TW | 201218070 | 5/2012 |
| TW | 201346724 | 11/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.

Boyd et al., "On the General Applicability of Instruction-Set Randomization", Jul.-Sep. 2010, (14 pgs.), vol. 7, Issue 3, IEEE Transactions on Dependable and Secure Computing.

Elliot, et al., "Computational RAM: Implementing Processors in Memory", Jan.-Mar. 1999, (10 pgs.), vol. 16, Issue 1, IEEE Design and Test of Computers Magazine.

Warren Jr., Henry S., "Hacker's Delight", Second Edition, Oct. 2013, pp. 181-184 and 194.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for PCT Application No. PCT/US2013/043702, dated Sep. 26, 2013, (11 pgs.).

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

Pagiamtzis, Kostas, "Content-Addressable Memory Introduction", Jun. 25, 2007, (6 pgs.), retrieved from: http://www.pagiamtzis.com/cam/camintro.

Debnath, Biplob, Bloomflash: Bloom Filter on Flash-Based Storage, 2011 31st Annual Conference on Distributed Computing Systems, Jun. 20-24, 2011, 10 pgs.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

\* cited by examiner

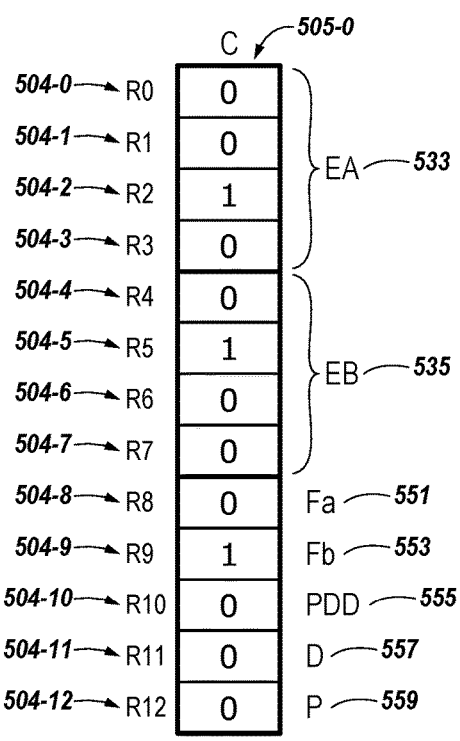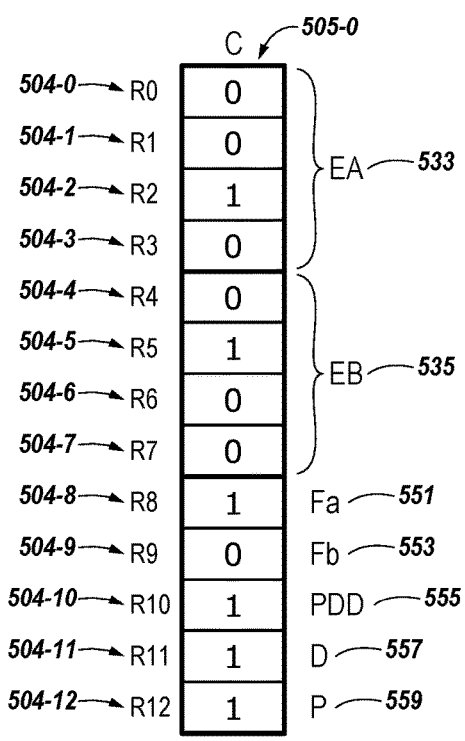
*Fig. 5C*  *Fig. 5D*

| | Fig. 6A | | | Fig. 6B | |
|---|---|---|---|---|---|
| 604-0 → R0 | 0 | ⎫ | 604-0 → R0 | 0 | ⎫ |
| 604-1 → R1 | 0 | ⎬ EA — 633 | 604-1 → R1 | 0 | ⎬ EA — 633 |
| 604-2 → R2 | 1 | | 604-2 → R2 | 1 | |
| 604-3 → R3 | 0 | ⎭ | 604-3 → R3 | 0 | ⎭ |
| 604-4 → R4 | 0 | ⎫ | 604-4 → R4 | 0 | ⎫ |
| 604-5 → R5 | 1 | ⎬ EB — 635 | 604-5 → R5 | 1 | ⎬ EB — 635 |
| 604-6 → R6 | 0 | | 604-6 → R6 | 0 | |
| 604-7 → R7 | 0 | ⎭ | 604-7 → R7 | 0 | ⎭ |
| 604-8 → R8 | 1 | Fa — 651 | 604-8 → R8 | 1 | Fa — 651 |
| 604-9 → R9 | 1 | Fb — 653 | 604-9 → R9 | 0 | Fb — 653 |
| 604-10 → R10 | 0 | PDD — 655 | 604-10 → R10 | 0 | PDD — 655 |
| 604-11 → R11 | 0 | D — 657 | 604-11 → R11 | 0 | D — 657 |
| 604-12 → R12 | 0 | P — 659 | 604-12 → R12 | 0 | P — 659 |
| 604-13 → R13 | 0 | T0 — 661-0 | 604-13 → R13 | 0 | T0 — 661-0 |
| 604-14 → R14 | 0 | T1 — 661-1 | 604-14 → R14 | 0 | T1 — 661-1 |
| 631 → | 1 | CC | 631 → | 1 | CC |

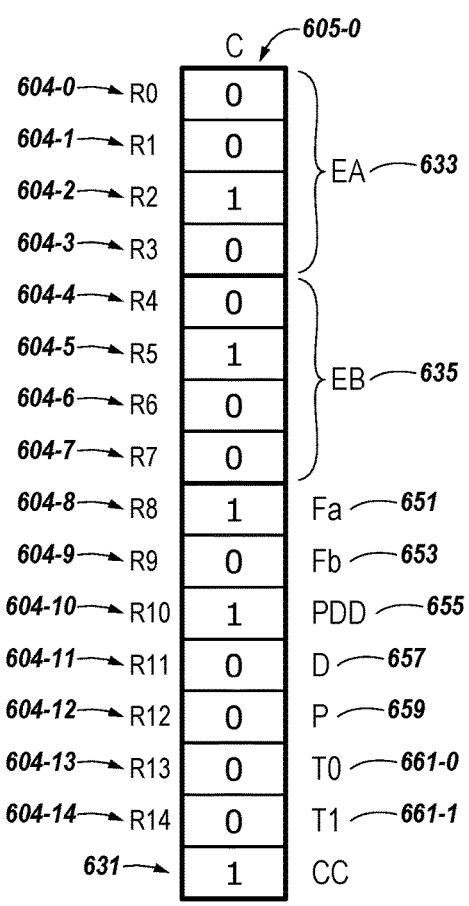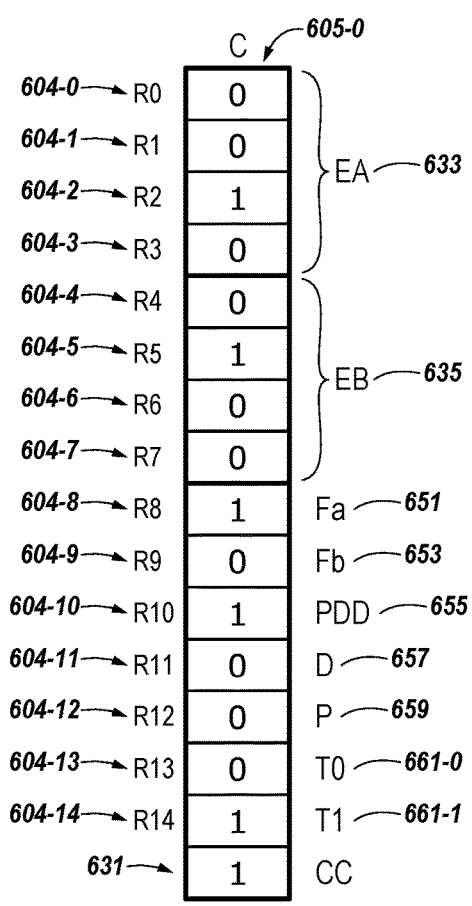
Fig. 6C                              Fig. 6D

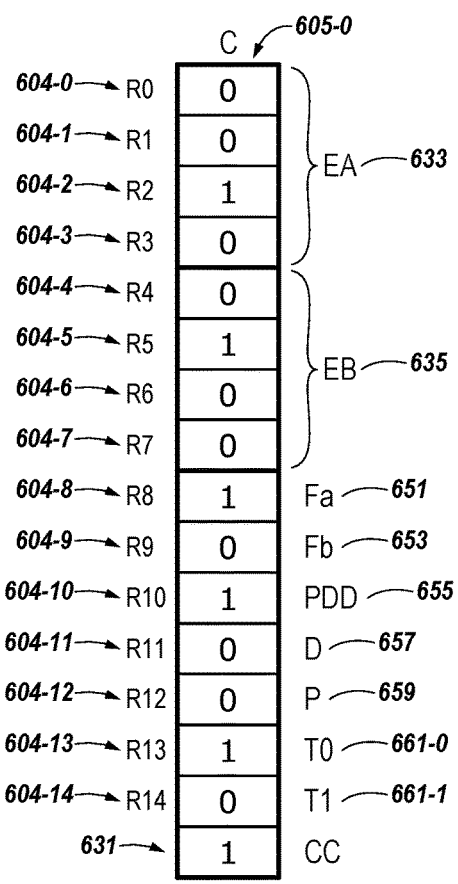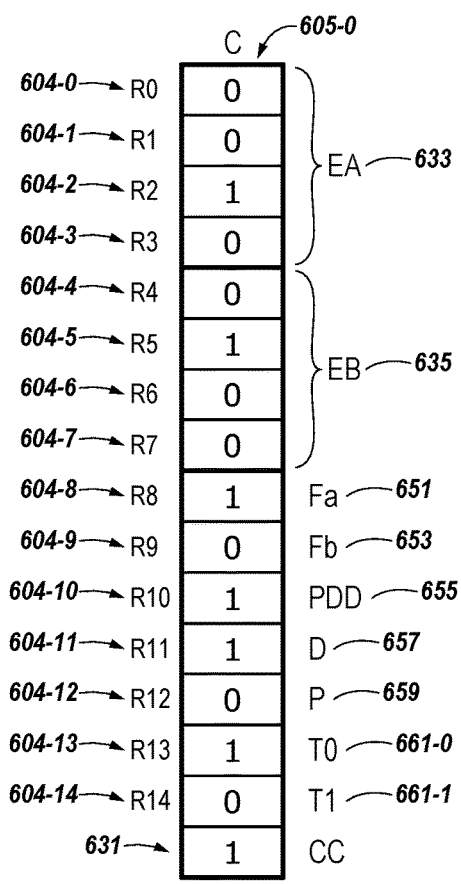
*Fig. 6E*    *Fig. 6F*

TABLE 7-1

| A (744) | B (745) | NOT OPEN (756) | OPEN TRUE (770) | OPEN INVERT (771) |
|---|---|---|---|---|
| 0 | 0 | 0 | 0 | 1 |
| 0 | 1 | 0 | 1 | 0 |
| 1 | 0 | 1 | 0 | 1 |
| 1 | 1 | 1 | 1 | 0 |

775

TABLE 7-2

|  | FF | 0 | 0 | 0 | 0 | 0 | 0 | 1 | 1 | 1 | ← 776 |
|---|---|---|---|---|---|---|---|---|---|---|---|
|  | FT | 0 | 0 | 0 | 1 | 1 | 1 | 0 | 0 | 0 | ← 777 |
|  | TF | 0 | 0 | 1 | 0 | 0 | 1 | 0 | 0 | 1 | ← 778 |
|  | TT | 0 | 1 | 0 | 0 | 1 | 0 | 0 | 1 | 0 | ← 779 |
| A | B | A | A*B | A*B̄ | A+B | B | AXB | A+B̄ | ĀXB̄ | B̄ | ← 747 |
| 0 | 0 | 0 | 0 | 0 | 0 | 0 | 0 | 1 | 1 | 1 |  |
| 0 | 1 | 0 | 0 | 0 | 1 | 1 | 1 | 0 | 0 | 0 |  |
| 1 | 0 | 1 | 0 | 1 | 1 | 0 | 1 | 1 | 0 | 1 |  |
| 1 | 1 | 1 | 1 | 0 | 1 | 1 | 0 | 1 | 1 | 0 |  |

(776–779 bracketed as 780)

ELEMENT VALUE COMPARISON IN MEMORY

TECHNICAL FIELD

The present disclosure relates generally to semiconductor memory and methods, and more particularly, to apparatuses and methods related to element value comparisons using sensing circuitry.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and/or division on operands via a number of logical operations.

A number of components in an electronic system may be involved in providing instructions to the functional unit circuitry for execution. The instructions may be generated, for instance, by a processing resource such as a controller and/or host processor. Data (e.g., the operands on which the instructions will be executed) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and/or data may also be sequenced and/or buffered.

In many instances, the processing resources (e.g., processor and/or associated functional unit circuitry) may be external to the memory array, and data is accessed via a bus between the processing resources and the memory array to execute a set of instructions. Processing performance may be improved in a processor-in-memory (PIM) device, in which a processor may be implemented internal and/or near to a memory (e.g., directly on a same chip as the memory array), which may conserve time and power in processing.

BRIEF DESCRIPTION OF THE DRAWINGS

FIGS. 5A-5E each illustrate the state of memory cells of an array at a particular iteration associated with performing an element value comparison in accordance with a number of embodiments of the present disclosure.

FIGS. 6A-6G each illustrate the state of memory cells of an array at a particular phase associated with performing an element value comparison in accordance with a number of embodiments of the present disclosure.

DETAILED DESCRIPTION

Figure 1:
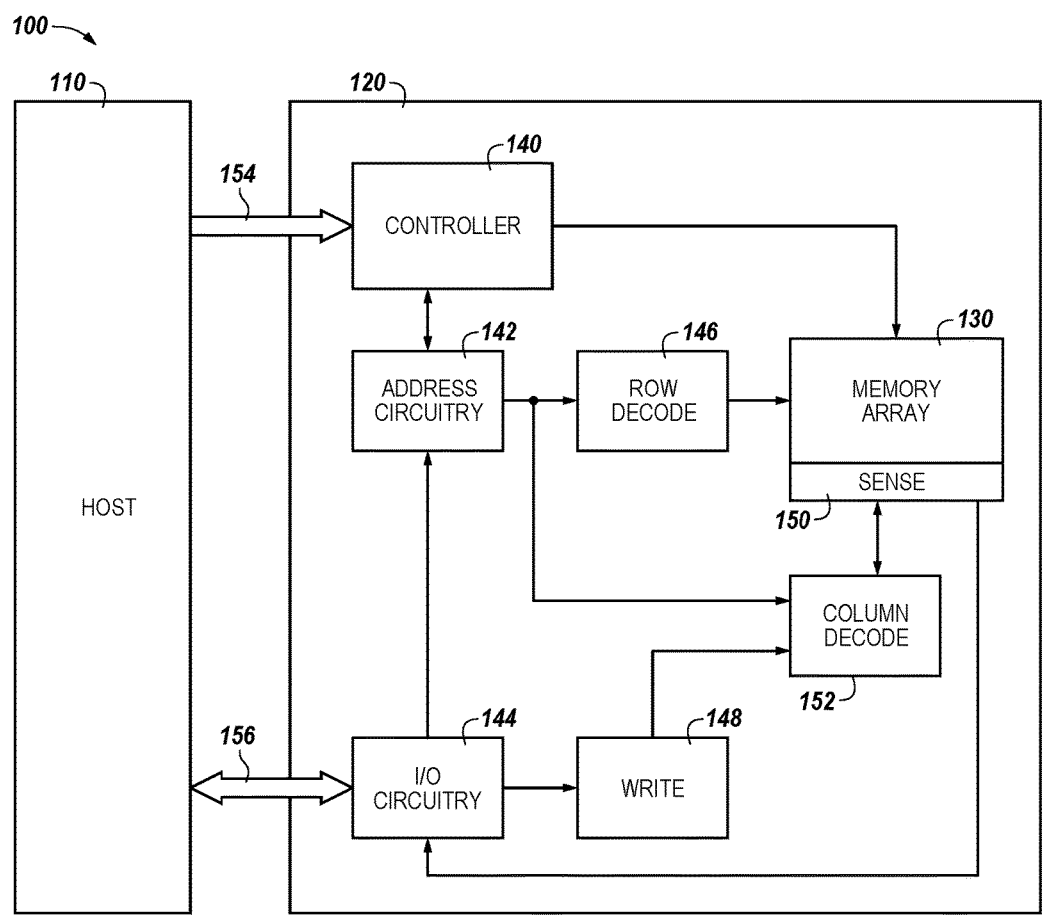
FIG. 1 is a block diagram of an apparatus in the form of a computing system including a memory device in accordance with a number of embodiments of the present disclosure.

The present disclosure includes apparatuses and methods related to performing an element value comparison in memory. An example apparatus comprises a first group of memory cells coupled to a sense line and to a number of first access lines and a second group of memory cells coupled to the sense line and to a number of second access lines. The example apparatus comprises a controller configured to operate sensing circuitry to compare a value of a first element stored in the first group of memory cells to a value of a second element stored in the second group of memory cells to determine whether the value of the first element is greater than the value of the second element.

According to various embodiments of the present disclosure, sensing circuitry is configured to perform a number of logical operations (e.g., AND operations, SHIFT operations, etc.) to perform the element value comparison operation. The element value comparison operation can include performing a comparison of a first vector stored in cells coupled to a same sense line and a plurality of first access lines to a second vector stored in cells coupled to the same sense line and a plurality of second access lines. The element value comparison operation can be performed without occupying a burdensome amount of temporary storage rows of cells as rows of cells may be limited. For example, storing vectors in cells coupled to a same sense line and a plurality of access lines (e.g., as is illustrated as stored "vertically" in FIG. 4) can occupy a greater number of rows of cells than storing the vector in cells coupled to a same access line and a plurality of sense lines (e.g., as is illustrated as stored "horizontally" in FIG. 4). For example, a 64 bit vector stored "vertically" could occupy 64 rows of cells, limiting the number of rows for use in comparing element values while storing the 64 bit vector "horizontally" could occupy one row of cells.

In this example, the "horizontal" storage would leave 63 additional rows of cells for further storage during the comparison of the element values than "vertical" storage. In some previous approaches, additional rows of cells would need to be added to an array and/or additional rows of cells of another memory array would be needed in response to all of the available rows of cells being used. In the description provided below, fewer rows of cells are used while comparing the element values in relation to elements stored "vertically" (e.g., in cells coupled to a same sense line and a plurality of access lines). In addition, a plurality of element value comparisons can be performed in parallel using the sensing circuitry described below without using a burdensome amount of rows of cells. For example, if 128 pairs of elements were stored "vertically" and each pair of elements consumed most of the available temporary rows of cells during an element value comparison, only one comparison could be performed at a time. However, if fewer rows of cells were used for one comparison, a plurality of comparisons could be performed in parallel.

Further, a number of embodiments of the present disclosure can provide improved parallelism and/or reduced power consumption in association with performing element value comparisons as compared to previous systems having an external processor (e.g., a processing resource located external from a memory array, such as on a separate integrated circuit chip). For instance, a number of embodiments can provide for performing fully complete logical operations such as integer add, subtract, multiply, divide, and CAM (content addressable memory) functions without transferring data out of the memory array and sensing circuitry via a bus (e.g., data bus, address bus, control bus), for instance. Such logical operations can involve performing a number of logical functions (e.g., logical functions such as AND, OR, NOT, NOR, NAND, XOR, etc.). However, embodiments are not limited to these examples. For instance, performing logical operations can include performing a number of non-Boolean logic operations such as sense amplifier set, sense amplifier clear, copy, compare, destroy, etc.

In some previous approaches, data may be transferred from the array and sensing circuitry (e.g., via a bus comprising input/output (I/O) lines) to a processing resource such as a processor, microprocessor, and/or compute engine, which may comprise ALU circuitry and/or other functional unit circuitry configured to perform the appropriate logical operations. However, transferring data from a memory array and sensing circuitry to such processing resource(s) can involve significant power consumption. Even if the processing resource is located on a same chip as the memory array, significant power can be consumed in moving data out of the array to the compute circuitry, which can involve performing a sense line (which may be referred to herein as a digit line or data line) address access (e.g., firing of a column decode signal) in order to transfer data from sense lines onto I/O lines (e.g., local I/O lines), moving the data to the array periphery, and providing the data to the circuitry to perform the compute function.

Some advantages of embodiments of the present disclosure over previous approaches can include capability for implementing a greater quantity of logical operations using a same circuit configuration, and increased flexibility in implementing a plurality of logical operations. Logical operations can be selected dynamically from among a number of possible logical operations. Capability to select a number of different logical operations to implement directly can result in faster operations with fewer manipulations and movements (e.g., storing intermediate results) of data. And direct implementation of a plurality of different logical operations can use less power to obtain a result due in part to less movement of intermediate results. Also, embodiments of the present disclosure can be used to directly implement XOR and XNOR logical operations (e.g., in a single operation), rather than by obtaining the result via one or more logical operations involving intermediate results.

Furthermore, the circuitry of the processing resource(s) (e.g., compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and/or memory density, for example. In contrast, the sensing circuitry 150 described herein can be formed on a same pitch as a pair of complementary sense lines. As an example, a pair of complementary memory cells may have a cell size with a $6F^2$ pitch (e.g., 3F×2F). If the pitch of a pair of complementary sense lines for the complementary memory cells is 3F, then the sensing circuitry being on pitch indicates the sensing circuitry (e.g., a sense amplifier and corresponding compute component per respective pair of complementary sense lines) is formed to fit within the 3F pitch of the complementary sense lines. In contrast, a number of embodiments of the present disclosure can include the sensing circuitry 150 (e.g., including sense amplifiers and/or compute components) being formed on pitch with the memory cells of the array. The sensing circuitry 150 can be configured for (e.g., capable of) performing logical operations. A number of embodiments of the present disclosure include sensing circuitry formed on pitch with memory cells of the array and capable of performing logical functions such as those described herein below.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N," particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 206 may reference element "06" in FIG. 2, and a similar element may be referenced as 406 in FIG. 4. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a memory array 130, a controller 140, and/or sensing circuitry 150 might also be separately considered an "apparatus."

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines. Although a single array 130 is shown in FIG. 1, embodiments are not so limited. For instance, memory device 120 may include a number of arrays 130 (e.g., a number of banks of DRAM cells). An example DRAM array is described in association with FIG. 2.

The memory device 120 includes address circuitry 142 to latch address signals provided over an I/O bus 156 (e.g., a data bus) through I/O circuitry 144. Address signals may also be received to controller 140 (e.g., via address circuitry 142 and/or via bus 154). Address signals are received and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Controller 140 decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110. The controller 140 can be a state machine, a sequencer, or some other type of control circuitry. Controller 140 can be implemented in hardware, firmware, and/or software. Controller 140 can also control shifting circuitry, which can be implemented, for example, in the sensing circuitry 150 according to various embodiments.

Examples of the sensing circuitry 150 are described further below. For instance, in a number of embodiments, the sensing circuitry 150 can comprise a number of sense amplifiers (e.g., sense amplifier shown as 206 in FIG. 2, 306 in FIG. 3, and/or 406 in FIG. 4) and a number of compute components (e.g., compute component shown as 231 in FIG. 2, 331 in FIG. 3, and/or 431 in FIG. 4), which can be used to perform logical operations (e.g., such as an element value comparison on data associated with complementary data lines). The sense amplifier can comprise a static latch, for example, which can be referred to herein as the primary latch. The compute component 231 can comprise a dynamic and/or static latch, for example, which can be referred to herein as the secondary latch, and which can serve as, and be referred to as, an accumulator.

In a number of embodiments, the sensing circuitry (e.g., 150) can be used to perform logical operations (e.g., element value comparison operations) using data stored in array 130 as inputs and store the results of the logical operations back to the array 130 without transferring data via a sense line address access (e.g., without firing a column decode signal). As such, various logical functions can be performed using, and within, sensing circuitry 150 rather than (or in association with) being performed by processing resources external to the sensing circuitry (e.g., by a processor associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform logical functions using the operands, and the result would be transferred back to the array (e.g., 130) via the I/O lines. In contrast, in a number of embodiments of the present disclosure, sensing circuitry (e.g., 150) is configured to perform logical operations on data stored in memory (e.g., array 130) and store the result back to the memory without enabling an I/O line (e.g., a local I/O line) coupled to the sensing circuitry, which can be formed on pitch with the memory cells of the array. Enabling an I/O line can include enabling (e.g., turning on) a transistor having a gate coupled to a decode signal (e.g., a column decode signal) and a source/drain coupled to the I/O line. Embodiments are not so limited. For instance, in a number of embodiments, the sensing circuitry (e.g., 150) can be used to perform logical operations without enabling column decode lines of the array; however, the local I/O line(s) may be enabled in order to transfer a result to a suitable location other than back to the array (e.g., to an external register).

As such, in a number of embodiments, various circuitry external to array 130 and sensing circuitry 150 (e.g., external registers associated with an ALU) is not needed to perform logical functions as the sensing circuitry 150 can perform the appropriate logical operations to perform such logical functions without the use of an external processing resource. Therefore, the sensing circuitry 150 may be used to compliment and/or to replace, at least to some extent, such an external processing resource (or at least the bandwidth of such an external processing resource). However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Figure 2:
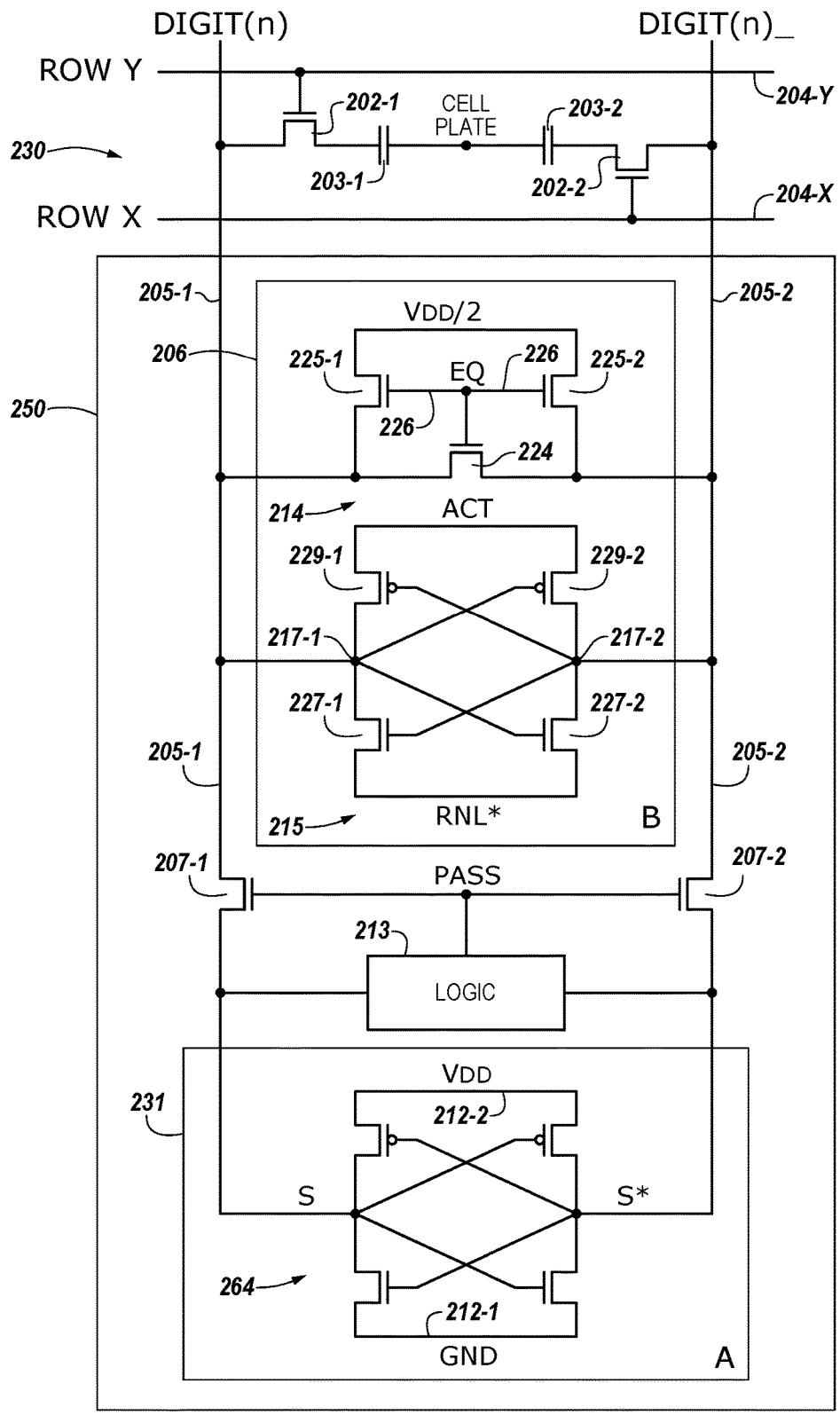
FIG. 2 is a schematic diagram illustrating sensing circuitry in accordance with a number of embodiments of the present disclosure.

FIG. 2 is a schematic diagram illustrating sensing circuitry in accordance with a number of embodiments of the present disclosure. A memory cell comprises a storage element (e.g., capacitor) and an access device (e.g., transistor). For instance, transistor 202-1 and capacitor 203-1 comprise a memory cell, and transistor 202-2 and capacitor 203-2 comprise a memory cell, etc. In this example, the memory array 230 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read).

The cells of the memory array 230 can be arranged in rows coupled by word lines 204-X (ROW X), 204-Y (ROW Y), etc., and columns coupled by pairs of complementary sense lines (e.g., data lines DIGIT(n)/DIGIT(n)_). The individual sense lines corresponding to each pair of complementary sense lines can also be referred to as data lines 205-1 (D) and 205-2 (D_) respectively. Although only one pair of complementary data lines (e.g., one column) are shown in FIG. 2, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-1 can be coupled to data line 205-1 (D), a second source/drain region of transistor 202-1 can be coupled to capacitor 203-1, and a gate of a transistor 202-1 can be coupled to word line 204-Y. A first source/drain region of a transistor 202-2 can be coupled to data line 205-2 (D_), a second source/drain region of transistor 202-2 can be coupled to capacitor 203-2, and a gate of a transistor 202-2 can be coupled to word line 204-X. The cell plate, as shown in FIG. 2, can be coupled to each of capacitors 203-1 and 203-2. The cell plate can be a common node to which a reference voltage (e.g., ground) can be applied in various memory array configurations.

The memory array 230 is coupled to sensing circuitry 250 in accordance with a number of embodiments of the present disclosure. In this example, the sensing circuitry 250 comprises a sense amplifier 206 and a compute component 231 corresponding to respective columns of memory cells (e.g., coupled to respective pairs of complementary data lines). The sensing circuitry 250 can correspond to sensing circuitry 150 shown in FIG. 1, for example. The sense amplifier 206 can be coupled to the pair of complementary sense lines 205-1 and 205-2. The compute component 231 can be coupled to the sense amplifier 206 via pass gates 207-1 and 207-2. The gates of the pass gates 207-1 and 207-2 can be coupled to logical operation selection logic 213.

The logical operation selection logic 213 can be configured to include pass gate logic for controlling pass gates that couple the pair of complementary sense lines 205-1 and 205-2 un-transposed between the sense amplifier 206 and the compute component 231 (as shown in FIG. 2) and/or swap gate logic for controlling swap gates that couple the pair of complementary sense lines transposed between the sense amplifier 206 and the compute component 231 (as is discussed later with respect to FIGS. 11, 12, 14, and 15, for example). The logical operation selection logic 213 can also be coupled to the pair of complementary sense lines 205-1 and 205-2. The logical operation selection logic 213 can be configured to control pass gates 207-1 and 207-2 (e.g., to control whether the pass gates 207-1 and 207-2 are in a conducting state or a non-conducting state) based on a selected logical operation, as described in detail below for various configurations of the logical operation selection logic 213.

The sense amplifier 206 can be operated to determine a data value (e.g., logic state) stored in a selected memory cell. The sense amplifier 206 can comprise a cross coupled latch, which can be referred to herein as a primary latch. In the example illustrated in FIG. 2, the circuitry corresponding to sense amplifier 206 comprises a latch 215 including four transistors coupled to the pair of complementary data lines 205-1 and 205-2. However, embodiments are not limited to this example. The latch 215 can be a cross coupled latch (e.g., gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2).

In operation, when a memory cell is being sensed (e.g., read), the voltage on one of the data lines 205-1 (D) or 205-2 (D_) will be slightly greater than the voltage on the other one of data lines 205-1 (D) or 205-2 (D_). An ACT signal can be driven high and the RNL* signal can be driven low to enable (e.g., fire) the sense amplifier 206. The data line 205-1 (D) or 205-2 (D_) having the lower voltage will turn on one of the PMOS transistor 229-1 or 229-2 to a greater extent than the other of PMOS transistor 229-1 or 229-2, thereby driving high the data line 205-1 (D) or 205-2 (D_) having the higher voltage to a greater extent than the other data line 205-1 (D) or 205-2 (D_) is driven high.

Similarly, the data line 205-1 (D) or 205-2 (D_) having the higher voltage will turn on one of the NMOS transistor 227-1 or 227-2 to a greater extent than the other of the NMOS transistor 227-1 or 227-2, thereby driving low the data line 205-1 (D) or 205-2 (D_) having the lower voltage to a greater extent than the other data line 205-1 (D) or 205-2 (D_) is driven low. As a result, after a short delay, the data line 205-1 (D) or 205-2 (D_) having the slightly greater voltage is driven to the voltage of the supply voltage VDD (e.g., through a source transistor (not shown)), and the other data line 205-1 (D) or 205-2 (D_) is driven to the voltage of the reference voltage (e.g., to ground (GND) through a sink transistor (not shown)). Therefore, the cross coupled NMOS transistors 227-1 and 227-2 and PMOS transistors 229-1 and 229-2 serve as a sense amplifier pair, which amplify the differential voltage on the data lines 205-1 (D) and 205-2 (D_) and operate to latch a data value sensed from the selected memory cell.

Embodiments are not limited to the sense amplifier 206 configuration illustrated in FIG. 2. As an example, the sense amplifier 206 can be current-mode sense amplifier and/or single-ended sense amplifier (e.g., sense amplifier coupled to one data line). Also, embodiments of the present disclosure are not limited to a folded data line architecture such as that shown in FIG. 2.

The sense amplifier 206 can, in conjunction with the compute component 231, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations associated therewith using less power than various previous approaches. Additionally, since a number of embodiments can eliminate the need to transfer data across I/O lines in order to perform logical functions (e.g., between memory and discrete processor), a number of embodiments can enable an increased parallel processing capability as compared to previous approaches.

The sense amplifier 206 can further include equilibration circuitry 214, which can be configured to equilibrate the data lines 205-1 (D) and 205-2 (D_). In this example, the equilibration circuitry 214 comprises a transistor 224 coupled between data lines 205-1 (D) and 205-2 (D_). The equilibration circuitry 214 also comprises transistors 225-1 and 225-2 each having a first source/drain region coupled to an equilibration voltage (e.g., VDD/2), where VDD is a supply voltage associated with the array. A second source/drain region of transistor 225-1 can be coupled data line 205-1 (D), and a second source/drain region of transistor 225-2 can be coupled data line 205-2 (D_). Gates of transistors 224, 225-1, and 225-2 can be coupled together, and to an equilibration (EQ) control signal line 226. As such, activating EQ enables the transistors 224, 225-1, and 225-2, which effectively shorts data lines 205-1 (D) and 205-2 (D_) together and to the an equilibration voltage (e.g., VDD/2).

Although FIG. 2 shows sense amplifier 206 comprising the equilibration circuitry 214, embodiments are not so limited, and the equilibration circuitry 214 may be implemented discretely from the sense amplifier 206, implemented in a different configuration than that shown in FIG. 2, or not implemented at all.

As described further below, in a number of embodiments, the sensing circuitry (e.g., sense amplifier 206 and compute component 231) can be operated to perform a selected logical operation and initially store the result in one of the sense amplifier 206 or the compute component 231 without transferring data from the sensing circuitry via an I/O line (e.g., without performing a data line address access via activation of a column decode signal, for instance).

Performance of logical operations (e.g., Boolean logical functions involving data values) is fundamental and commonly used. Boolean logical functions are used in many higher level functions. Consequently, speed and/or power efficiencies that can be realized with improved logical operations, which can translate into speed and/or power efficiencies of higher order functionalities. Described herein are apparatuses and methods for performing logical operations without transferring data via an input/output (110) line and/or without transferring data to a control component external to the array. Depending on memory array architecture, the apparatuses and methods for performing the logical operations may not require amplification of a sense line (e.g., data line, digit line, bit line) pair.

As shown in FIG. 2, the compute component 231 can also comprise a latch 264, which can be referred to herein as a secondary latch. The secondary latch 264 can be configured and operated in a manner similar to that described above with respect to the primary latch 215, with the exception that the pair of cross coupled p-channel transistors (e.g., PMOS transistors) comprising the secondary latch can have their respective sources coupled to a supply voltage (e.g., VDD), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component is not limited to that shown in FIG. 2 at 231, and various other embodiments are described further below.

Figure 3:
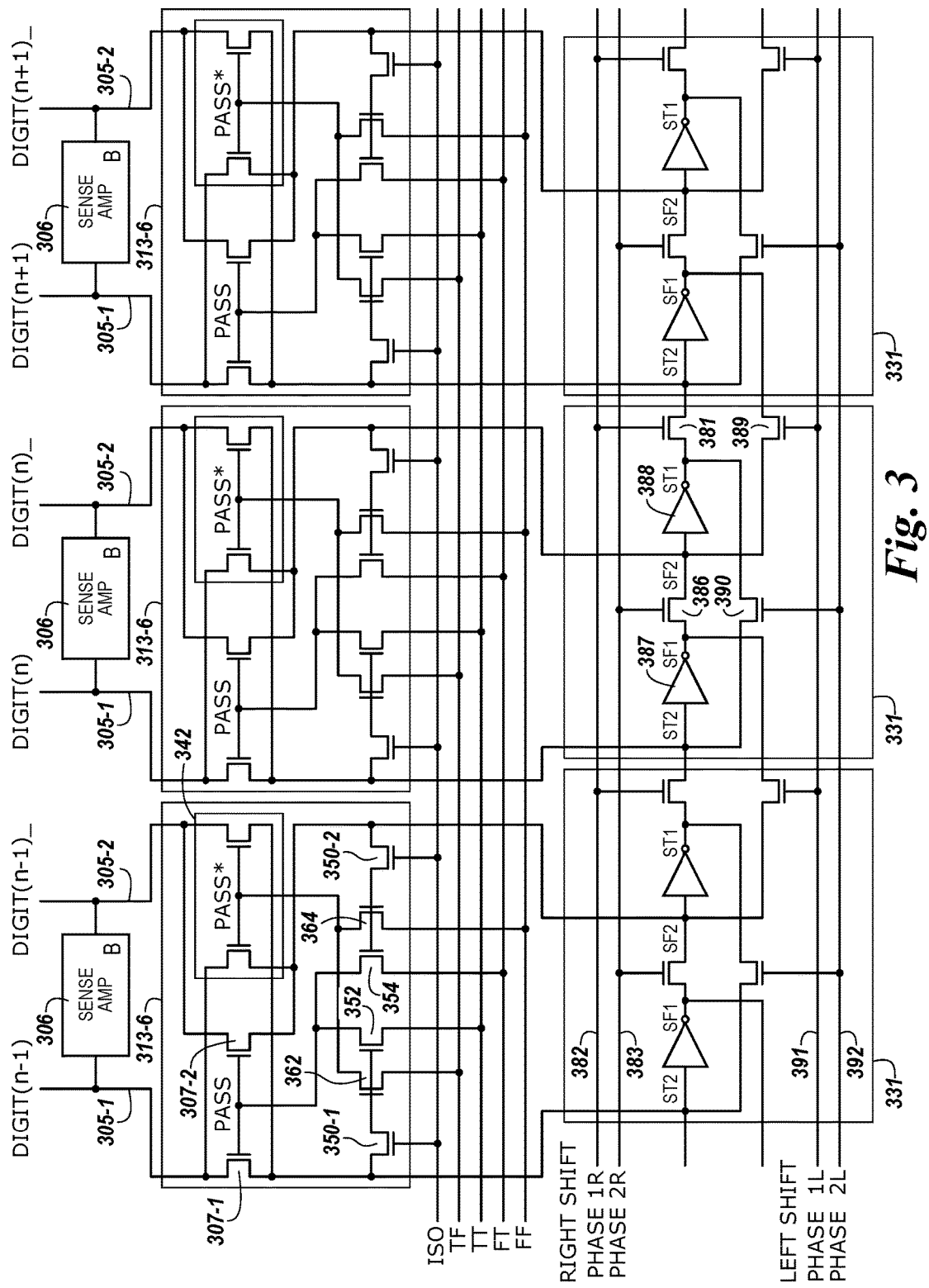
FIG. 3 is a schematic diagram illustrating sensing circuitry having selectable logical operation selection logic in accordance with a number of embodiments of the present disclosure.

FIG. 3 is a schematic diagram illustrating sensing circuitry having selectable logical operation selection logic in accordance with a number of embodiments of the present disclosure. FIG. 3 shows a number of sense amplifiers 306 coupled to respective pairs of complementary sense lines 305-1 and 305-2, and a corresponding number of compute component 331 coupled to the sense amplifiers 306 via pass gates 307-1 and 307-2. The gates of the pass gates 307-1 and 307-2 can be controlled by a logical operation selection logic signal, PASS. For example, an output of the logical operation selection logic 313-6 can be coupled to the gates of the pass gates 307-1 and 307-2.

According to the embodiment illustrated in FIG. 3, the compute components 331 can comprise respective stages (e.g., shift cells) of a loadable shift register configured to shift data values left and right. According to some embodiments, the compute component 331 can have bidirectional shift capabilities. According to various embodiments of the present disclosure, the compute components 331 can comprise a loadable shift register (e.g., with each compute component 331 serving as a respective shift stage) configured to shift in multiple directions (e.g., right and left). According to various embodiments of the present disclosure, the compute components 331 can comprise respective stages (e.g., shift cells) of a loadable shift register configured to shift in one direction. The loadable shift register can be coupled to the pairs of complementary sense lines 305-1 and 305-2, with node ST2 of each stage being coupled to the sense line (e.g., DIGIT(n)) communicating a true data value and with node SF2 of each stage being coupled to the sense line (e.g., DIGIT(n)_) communicating a complementary (e.g., false) data value.

According to some embodiments and as illustrated in FIG. 3, each compute component 331 (e.g., stage) of the shift register comprises a pair of right-shift transistors 381 and 386, a pair of left-shift transistors 389 and 390, and a pair of inverters 387 and 388. The signals PHASE 1R, PHASE 2R, PHASE 1L, and PHASE 2L can be applied to respective control lines 382, 383, 391 and 392 to enable/disable feedback on the latches of the corresponding compute components 331 in association with performing logical operations and/or shifting data in accordance with embodiments described herein. Examples of shifting data (e.g., from a particular compute component 331 to an adjacent compute component 331) is described further below with respect to FIGS. 8 and 9.

The compute components 331 (e.g., stages) of the loadable shift register can comprise a first right-shift transistor 381 having a gate coupled to a first right-shift control line 382 (e.g., "PHASE 1R"), and a second right-shift transistor 386 having a gate coupled to a second right-shift control line 383 (e.g., "PHASE 2R"). Node ST2 of each stage of the loadable shift register is coupled to an input of a first inverter 387. The output of the first inverter 387 (e.g., node SF1) is coupled to one source/drain of the second right-shift transistor 386, and another source/drain of the second right-shift transistor 386 is coupled to an input of a second inverter 388 (e.g., node SF2). The output of the second inverter 388 (e.g., node ST1) is coupled to one source/drain of the first right-shift transistor 381, and another source/drain of the first right-shift transistor 381 is coupled to an input of a second inverter (e.g., node ST2) for an adjacent compute component 331. Transistor 390 has a gate coupled to the PHASE 2L control line 392. One source/drain of the transistor 390 is coupled to node ST2, and another source/drain of the transistor 390 is coupled to node ST1.

Sense amplifiers 306 can be coupled to respective pairs of complementary sense lines 305-1 and 305-2, and corresponding compute components 331 coupled to the sense amplifiers 306 via respective pass gates 307-1 and 307-2. The gates of the pass gates 307-1 and 307-2 can be controlled by respective logical operation selection logic signals, "Passd" and "Passdb," which can be output from logical operation selection logic (not shown for clarity).

A first left-shift transistor 389 is coupled between node SF2 of one loadable shift register stage and node SF1 of a loadable shift register stage corresponding to an adjacent compute component 331. The channel of second left-shift transistor 390 is coupled from node ST2 to node ST1. The gate of the first left-shift transistor 389 is coupled to a first left-shift control line 391 (e.g., "PHASE 1L"), and the gate of the second left-shift transistor 390 is coupled to a second left-shift control line 392 (e.g., "PHASE 2L").

Figure 8:
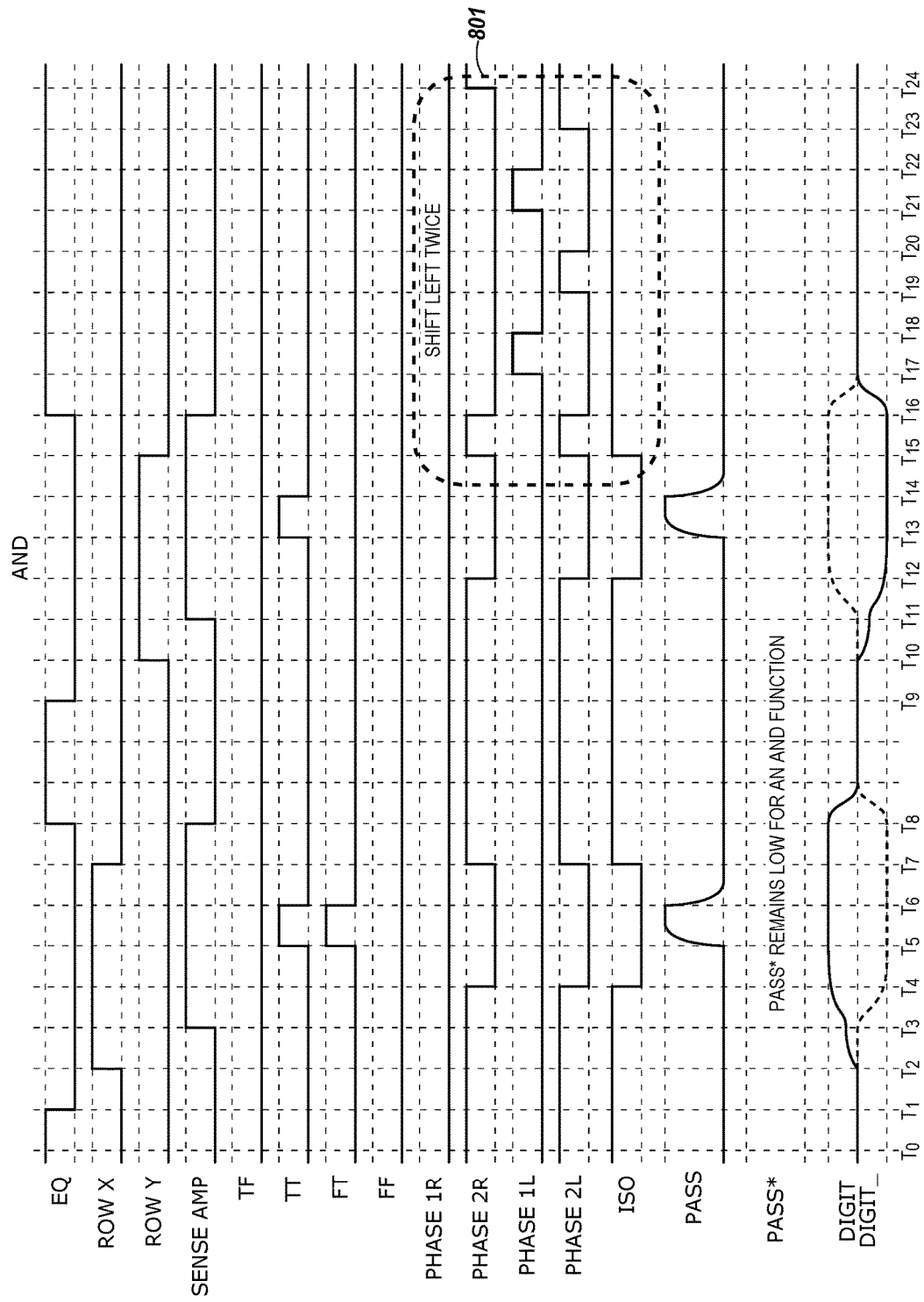
FIG. 8 illustrates a timing diagram associated with performing a logical operation and a shifting operation using the sensing circuitry in association with performing element value comparison in accordance with a number of embodiments of the present disclosure.
Figure 9:
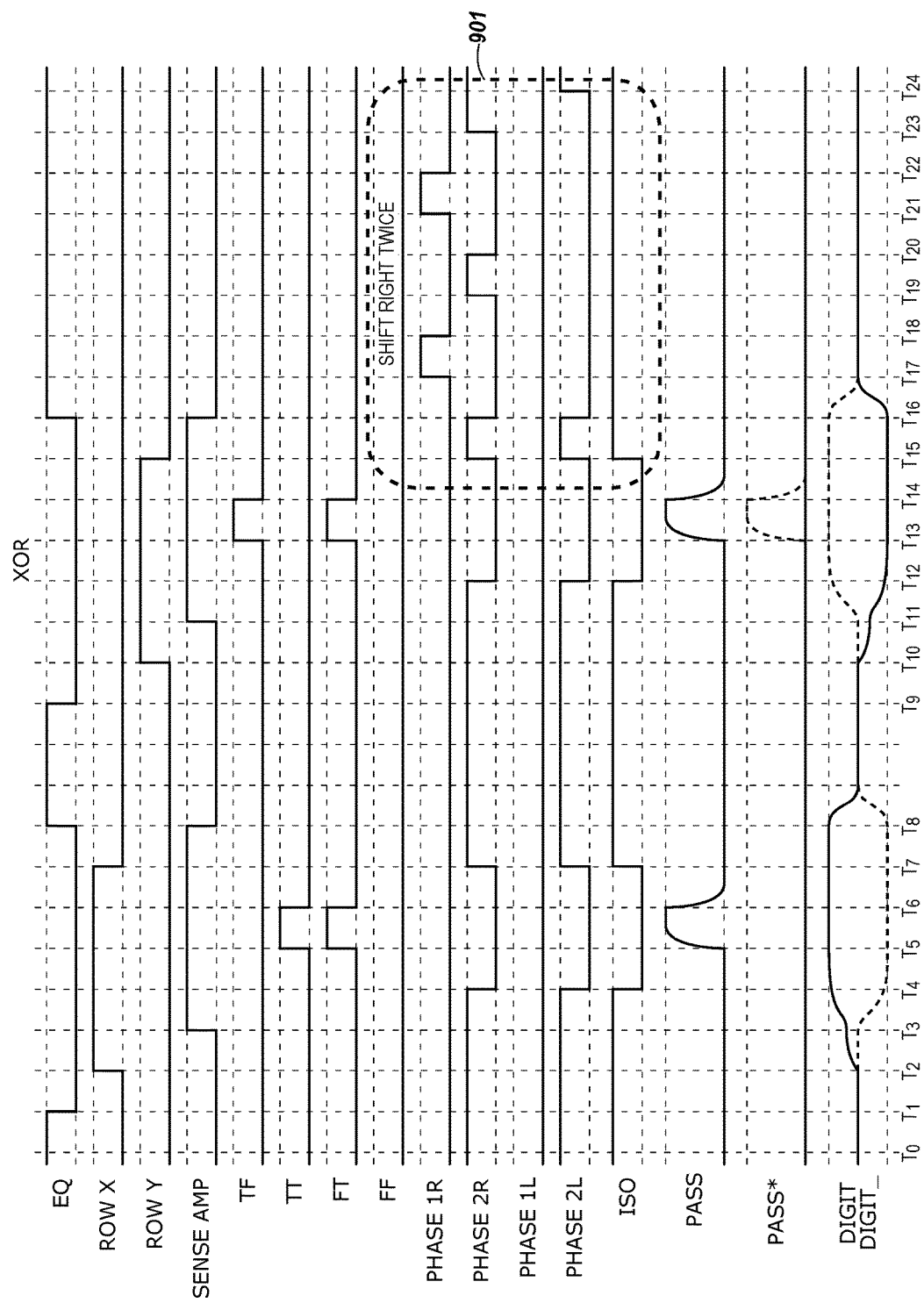
FIG. 9 illustrates a timing diagram associated with performing a logical operation and a shifting operation using the sensing circuitry in association with performing element value comparison in accordance with a number of embodiments of the present disclosure.

The logical operation selection logic 313-6 includes the swap gates 342, as well as logic to control the pass gates 307-1 and 307-2 and the swap gates 342. The logical operation selection logic 313-6 includes four logic selection transistors: logic selection transistor 362 coupled between the gates of the swap transistors 342 and a TF signal control line, logic selection transistor 352 coupled between the gates of the pass gates 307-1 and 307-2 and a TT signal control line, logic selection transistor 354 coupled between the gates of the pass gates 307-1 and 307-2 and a FT signal control line, and logic selection transistor 364 coupled between the gates of the swap transistors 342 and a FF signal control line. Gates of logic selection transistors 362 and 352 are coupled to the true sense line through isolation transistor 350-1 (having a gate coupled to an ISO signal control line). Gates of logic selection transistors 364 and 354 are coupled to the complementary sense line through isolation transistor 350-2 (also having a gate coupled to an ISO signal control line). FIGS. 8 and 9 illustrate timing diagrams associated with performing logical operations and shifting operations using the sensing circuitry shown in FIG. 3.

Data values on the respective pairs of complementary sense lines 305-1 and 305-2 can be loaded into the corresponding compute components 331 (e.g., loadable shift register) by causing the pass gates 307-1 and 307-2 to conduct, such as by causing the Passd control signal to go high. Gates that are controlled to have continuity (e.g., electrical continuity through a channel) are conducting, and can be referred to herein as being OPEN. Gates that are controlled to not have continuity (e.g., electrical continuity through a channel) are said to be non-conducting, and can be referred to herein as being CLOSED. For instance, continuity refers to a low resistance condition in which a gate is conducting. The data values can be loaded into the respective compute components 331 by either the sense amplifier 306 overpowering the corresponding compute component 331 (e.g., to overwrite an existing data value in the compute component 331) and/or by turning off the PHASE 1R and PHASE 2R control signals 380 and 382 and the LATCH control signal 384. A first latch (e.g., sense amplifier) can be configured to overpower a second latch (e.g., compute component) when the current provided by the first latch and presented to the second latch is sufficient to flip the second latch.

The sense amplifier 306 can be configured to overpower the compute component 331 by driving the voltage on the pair of complementary sense lines 305-1 and 305-2 to the maximum power supply voltage corresponding to a data value (e.g., driving the pair of complementary sense lines 305-1 and 305-2 to the rails), which can change the data value stored in the compute component 331. According to a number of embodiments, the compute component 331 can be configured to communicate a data value to the pair of complementary sense lines 305-1 and 305-2 without driving the voltages of the pair of complementary sense lines 305-1 and 305-2 to the rails (e.g., to VDD or GND). As such, the compute component 331 can be configured to not overpower the sense amplifier 306 (e.g., the data values on the pair of complementary sense lines 305-1 and 305-2 from the compute component 331 will not change the data values stored in the sense amplifier 306 until the sense amplifier is enabled.

Once a data value is loaded into a compute component 331 of the loadable shift register, the true data value is separated from the complement data value by the first inverter 387. The data value can be shifted to the right (e.g., to an adjacent compute component 331) by alternate operation of first right-shift transistor 381 and second right-shift transistor 386, which can be accomplished when the first right-shift control line 382 and the second right-shift control line 383 have periodic signals that go high out-of-phase from one another (e.g., non-overlapping alternating square waves 180 degrees out of phase with one another). The PHASE 2L control signal can be activated to cause transistor 390 to conduct, thereby latching the data value into a corresponding compute component 331 of the loadable shift register (e.g., while signal PHASE 1R remains low and PHASE 2R remains high to maintain the data value latched in the compute component 331).

Figure 4:
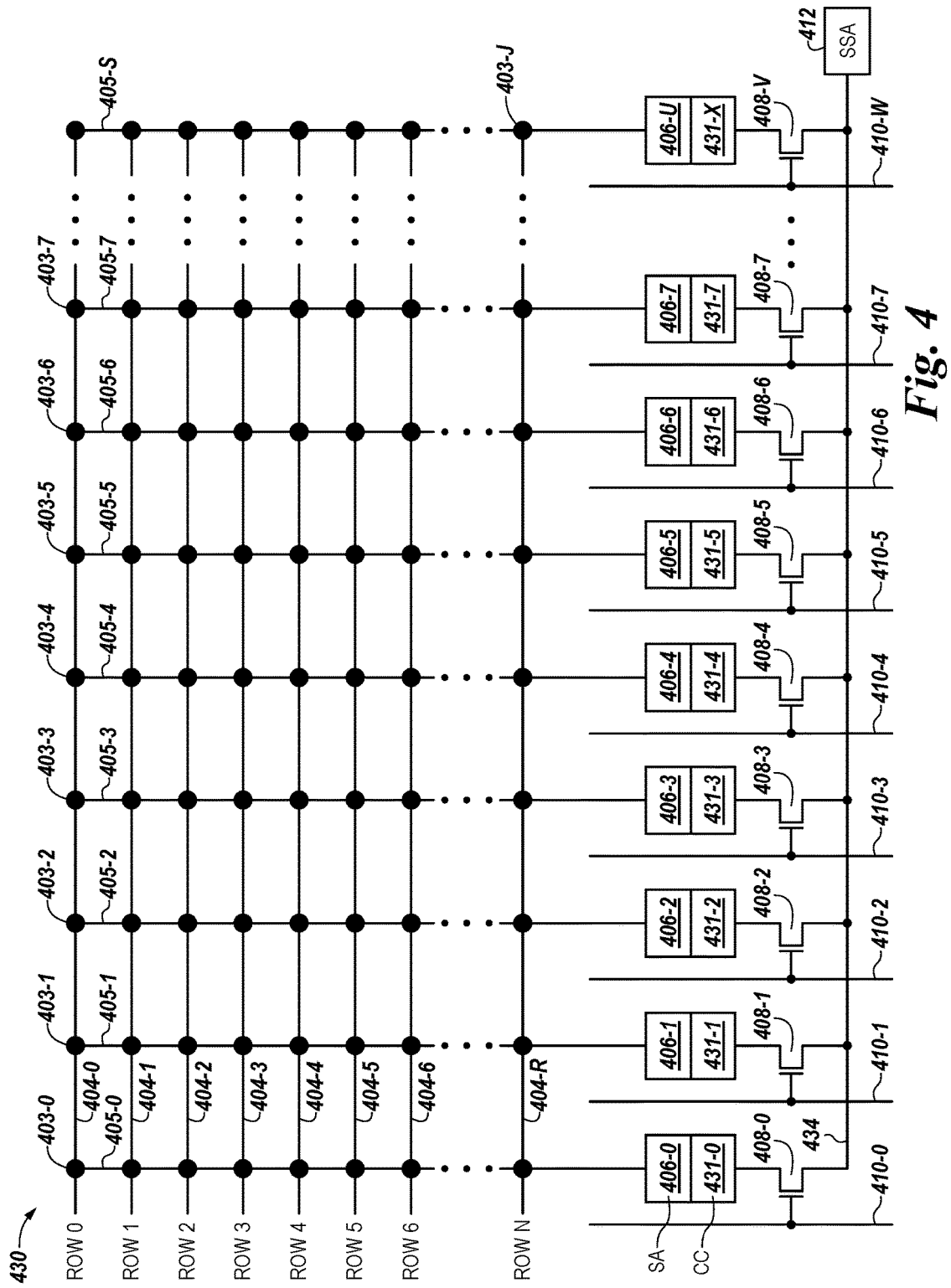
FIG. 4 is a schematic diagram of a portion of a memory array in accordance with a number of embodiments of the present disclosure.

FIG. 4 illustrates a schematic diagram of a portion of a memory array 430 in accordance with a number of embodiments of the present disclosure. The array 430 includes memory cells (referred to generally as memory cells 403, and more specifically as 403-0 to 403-J) coupled to rows of access lines 404-0, 404-1, 404-2, 404-3, 404-4, 404-5, 404-6, . . . , 404-R and columns of sense lines 405-0, 405-1, 405-2, 405-3, 405-4, 405-5, 405-6, 405-7, . . . , 405-S. Memory array 430 is not limited to a particular number of access lines and/or sense lines, and use of the terms "rows" and "columns" does not intend a particular physical structure and/or orientation of the access lines and/or sense lines. Although not pictured, each column of memory cells can be associated with a corresponding pair of complementary sense lines (e.g., complementary sense lines 305-1 and 305-2 in FIG. 3).

Each column of memory cells can be coupled to sensing circuitry (e.g., sensing circuitry 150 shown in FIG. 1). In this example, the sensing circuitry comprises a number of sense amplifiers 406-0, 406-1, 406-2, 406-3, 406-4, 406-5, 406-6, 406-7, . . . , 406-U coupled to the respective sense lines 405-0, 405-1, 405-2, 405-3, 405-4, 405-5, 405-6, 405-7, . . . , 405-S. The sense amplifiers 406 are coupled to input/output (I/O) line 434 (e.g., a local I/O line) via access devices (e.g., transistors) 408-0, 408-1, 408-2, 408-3, 408-4, 408-5, 408-6, 408-7, . . . , 408-V. In this example, the sensing circuitry also comprises a number of compute components 431-0, 431-1, 431-2, 431-3, 431-4, 431-5, 431-6, 431-7, . . . , 431-X coupled to the respective sense lines. Column decode lines 410-1 to 410-W are coupled to the gates of transistors 408-1 to 408-V, respectively, and can be selectively activated to transfer data sensed by respective sense amps 406-0 to 406-U and/or stored in respective compute components 431-0 to 431-X to a secondary sense amplifier 412. In a number of embodiments, the compute components 431 can be formed on pitch with the memory cells of their corresponding columns and/or with the corresponding sense amplifiers 406.

In a number of embodiments, the sensing circuitry (e.g., compute components 431 and sense amplifiers 406) is configured to perform an element value comparison on elements stored in array 401. As an example, a first element (e.g., a 4-bit element) can be stored in a first group of memory cells coupled to sense line 405-0 and to a number of access lines 404-0, 404-1, 404-2, and 404-3 and a second element can be stored in a second group of memory cells coupled to the sense line 405-0 and to a number of access lines 404-4, 404-5, 404-6, 404-7 (not illustrated), referred to herein as stored in a horizontal fashion, as illustrated. A number of element value comparison operations can be performed to compare the first element to the second element using fewer temporary storage rows (indicated by rows 404-R) than previous approaches, where storage rows refers to cells coupled to access lines (e.g., 404-R to indicate a plurality of additional rows) and a sense line (e.g., sense line 405-0).

In a number of embodiments, the sensing circuitry (e.g., compute components 431 and sense amplifiers 406) is configured to perform element value comparison operations on a plurality of elements stored in array 401. As an example, a first plurality of elements can be stored in a first group of memory cells, where each element is stored in cells coupled to a single sense line and to a same plurality of access lines (e.g., a first element of the first group stored in cells coupled to sense line 405-0 and to access lines 404-0, 404-1, 404-2, 404-3, a second element of the first group stored in cells coupled to sense line 405-1 and to access lines 404-0, 404-1, 404-2, 404-3, etc.). A second plurality of elements can be stored in a second group of memory cells, where each element is stored in cells coupled to a single sense line and to a same plurality of access lines (e.g., a first element of the second group stored in cells coupled to sense line 405-0 and to access lines 404-4, 404-5, 404-6, 404-7, a second element of the second group stored in cells coupled to sense line 405-1 and to access lines 404-4, 404-5, 404-6, 404-7). In performing an element value comparison, the first element of the first group and the first element of the second group would be compared and the second element of the first group and the second element of the second group would be compared, and so forth.

FIGS. 5A-5E each illustrate the state of memory cells of an array at a particular iteration associated with performing an element value comparison in accordance with a number of embodiments of the present disclosure. The rows of cells 504-0 (R0) to 504-12 (R12) of FIGS. 5A-5E correspond to respective rows of cells (e.g., ROW 0 to ROW N, designated by access lines 404-0 to 404-R) and a sense line column 505-0 (C), which the example elements 533 (EA) and 535 (EB) are illustrated as stored "vertically" (e.g., in cells corresponding to a particular column of an array) Element EA (e.g., bit-vector [0100]) is stored in memory cells coupled to access lines 504-0 to 504-3 and to sense line 505-0 and element EB (e.g., bit-vector [0010]) is stored in memory cells coupled to access lines of rows 504-4 to 504-7. Element A ("EA") has a numerical decimal value of "4" and Element B ("EB") has a numerical decimal value of "2." The comparison performed in accordance with the below description will result in a determination of whether the value of EA is greater than the value of EB (e.g., whether "4" is greater than "2"). Rows 504-8 (R8) to row 504-12 (R12) include memory cells used to store variables 551 (Fa), 553 (Fb), 555 (PDD), 557 (D), and 559 (P), which serve as intermediate results of the comparison operations described further below. T0, in the pseudocode below, is in reference to a temporary storage row 0 (what would be illustrated in FIG. 4 as ROW 13 and is illustrated as T0 661-0 in FIG. 6A-6G). T1, in the pseudocode below, is in reference to a temporary storage row 1 (what would be illustrated in FIG. 4 as ROW 14 and is illustrated as T0 661-1 in FIG. 6A-6G). 551 is associated with a function "a" in relation to element A, 553 is associated with a function "b" in relation to element B, 555 is associated with a prior determination of variable D, 557 is associated with D (, e.g., a destination or result of the compare operations), and 559 ("P") is associated with a prior F, described further below. 551, 553, 555, 557, and 559 are single row 1-bit information that are associated with (e.g., stored in) horizontal vectors and correspond to an element (e.g., one of elements A and B, for example).

Figure 5A:
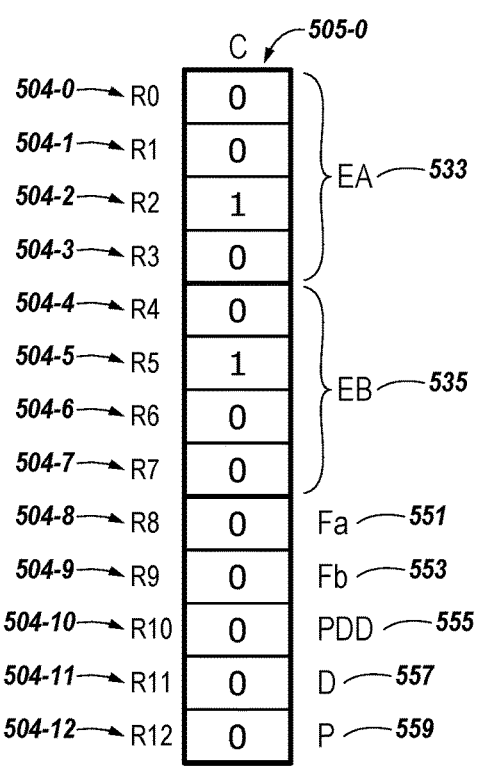
Figure 5B:
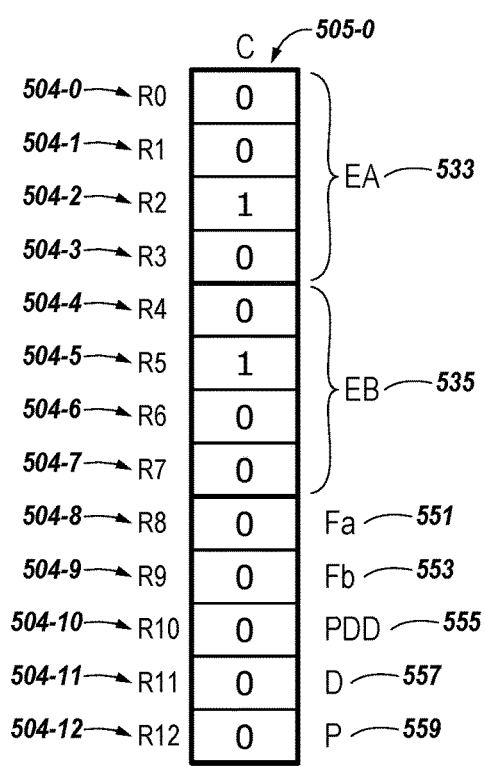
Figure 5E:
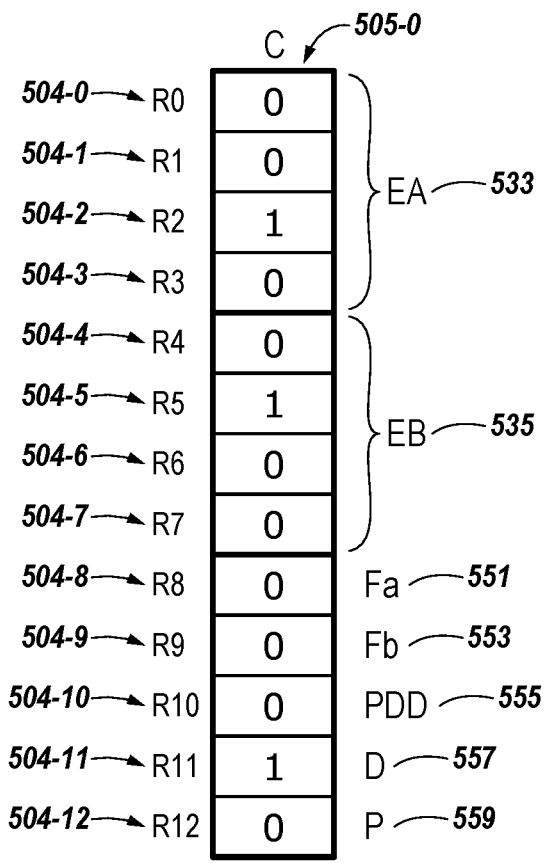

Each subsequent figure of FIGS. 5A through 5E illustrate an iteration of a number of element value comparison operations. For example, FIG. 5A illustrates an initial setup (e.g., initialization) associated with performing the element value comparison operations, FIG. 5B is associated with performing a first iteration of the pseudocode (e.g., execution of the operation phases associated with reference numbers 1.a to 5), FIG. 5C is associated with performing a second iteration of the pseudocode, FIG. 5D is associated with performing a third iteration of the pseudocode, and FIG. 5E is associated with performing a fourth iteration of the pseudocode.

Each iteration of the pseudocode is associated with a particular data unit position of the elements EA and EB stored in memory cells of rows R0 to R7 504-0 to 504-7, respectively. For example, EA includes a "0" (e.g., bolded in [0100]) in a first data unit position (e.g., least significant bit (LSB) position), a "0" (e.g., bolded in [0100]) in a second data unit position, a "1" (e.g., bolded in [0100]) in a third data unit position, and a "0" (e.g., bolded in [0100]) in a fourth data unit position (e.g., a most significant bit (MSB) position). A first iteration (illustrated by FIG. 5B) is associated with executing operation phases of the pseudocode associated with reference number 1.a to 5 to compare data units of each of EA and EB in a first data unit position (e.g., the LSB position). A second iteration (illustrated by FIG. 5C) is associated with executing operation phases of the pseudocode to compare data units of each of EA and EB in a second data unit position, a third iteration (illustrated by FIG. 5D) is associated with executing operation phases to compare data units of each of EA and EB in a third data unit position, and a fourth iteration (illustrated by FIG. 5E) is associated with executing operation phases to compare data units of each of EA and EB in a fourth data unit position. For ease of illustration, execution of each particular phase of the pseudocode for the element value comparison of the third iteration, associated with FIG. 5D, is described in greater detail in association with FIGS. 6A-6G. The third iteration is chosen for further description as a greater number of variables experience a change in their values, such as from a data unit of "0" to a data unit "1" and vice versa and best describes performing the element value comparison operations.

As used herein, a vector (e.g., a bit-vector) can include a number (e.g., one or more) of elements. In this example, each element 533 and 535 can be referred to as a single element vector, as well. As used herein, the term "bit vector"

is intended to mean a physically contiguous number of bits on a bit vector memory device (e.g., a memory device such as device 120 shown in FIG. 1, which can include sensing circuitry serving as a number of 1-bit processing elements on a per column basis), whether physically contiguous in rows (e.g., horizontally oriented) or columns (e.g., vertically oriented, such as column 505-0) in an array of memory cells. Thus, as used herein an operation on a bit vector can be intended to mean an operation that is performed on a bit-vector that is a contiguous portion of virtual address space of a bit-vector memory device. For example, a virtual address space may have a bit length of 256 bits. A portion of the virtual address space may or may not be contiguous physically to other portions in the virtual address space.

The pseudocode below represents instructions executable to perform a number of element value comparison operations in a memory in accordance with a number of embodiments of the present disclosure. The example pseudocode is referenced using reference numbers 1 to 5, which correspond to the five variables 551 (Fa), 553 (Fb), 555 (PDD), 557 (D), and 559 (P), respectively.

0. Store EA and EB, initialize temp rows
   I. Run Outer Loop for Element Length;
      1.a $EA_i$ AND $EB_i \rightarrow T0$
      1.b. $EA_i$ AND I(T 0)$\rightarrow$Fa
      2.a $EA_i$ AND $EB_i \rightarrow T0$
      2.b $EB_i$ AND I(T0)$\rightarrow$Fb
      3.a Fa AND Fb$\rightarrow$T0
      3.b P AND I(T0)$\rightarrow$T0
      3.c Fa OR T0$\rightarrow$PDD
      4.a D AND I(PDD)$\rightarrow$T0
      4.b PDD AND I(D)$\rightarrow$T1
      4.c T0 OR T1$\rightarrow$T0
      4.d D AND PDD$\rightarrow$T1
      4.e T0 OR T1$\rightarrow$D
      5 P=Fa For purposes of discussion, the above pseudocode will be divided into a number of phases associated with determining a variable associated with a particular data unit position of the vectors. For example, pseudocode associated with a setup phase (pseudocode associated with a first phase (e.g., reference number "1") can be executed to determine a value of 551. The first phase can include execution of pseudocode associated with reference numbers 1.a and 1.b. Likewise, pseudocode associated with a second phase (including pseudocode associated with reference numbers 2.a and 2.b) can be executed to determine a value of variable 553, pseudocode associated with a third phase (including pseudocode associated with reference numbers 3.a to 3.c) can be executed to determine a value of variable 555, pseudocode associated with a fourth phase (including pseudocode associated with reference numbers 4.a to 4.e) can be executed to determine a value of variable 557, and pseudocode associated with a fifth phase (including pseudocode associated with reference number 5) can be executed to update a value of variable 559. Reference number "I" (e.g., "Run Outer Loop for Element Length") of the above pseudocode is associated with performing a LOOP including a number of iterations corresponding to an element length. In this example, each of elements 533 and 535 are 4 bits in length wide, therefore four iterations of the loop can be performed (and four will be illustrated for ease of reference as a result is achieved after four iterations). Further, in association with a particular data unit position associated with each iteration, reference numbers 1.a to 1.b of the pseudocode are associated with determining variable 551, reference numbers 2.a to 2.b are associated with determining variable 553, reference numbers 3.a to 3.c are associated with determining variable 555, reference numbers 4.a to 4.e are associated with determining variable 557, and reference number 5 is associated with determining 559.

In a number of embodiments, the setup phase can be performed simultaneously for all the elements being compared to (e.g., to determine whether values of a number of first elements are greater than respective values of a corresponding number of second elements). While two elements (or two single element vectors) are illustrated as being stored in a single column, examples are not so limited. For example, a column of cells adjacent to the illustrated column 505-0 can include an additional two elements to be compared, and so forth, for any number of columns. For each column with a number of elements to be compared, a number of rows will be used to store the results (e.g., store the determined variables mentioned above).

FIG. 5A illustrates a setup phase of the element value comparison operation, associated with reference number 0 (e.g., "Store EA and EB, initialize temp rows") of the above pseudocode. The setup phase associated with FIG. 5A includes storing element 533 in cells coupled to access lines 504-0 through 504-3 (e.g., R0 to R3) and storing element 535 in cells coupled to access lines 504-4 to 504-7 (e.g., R4 to R7). In addition, the setup phase, as illustrated in FIG. 5A, includes initializing additional memory cells (e.g., initially clearing out previous data and/or storing a "0" in the cells) coupled to access lines 504-8 to 504-12 associated with variables 551, 553, 555, 557, and 559, respectively) and including T0 and T1, to store subsequent results of the element value comparison operations.

FIG. 5B illustrates results after performing a first iteration of element value comparison operations on first data units in a first data unit position of 533 (e.g., bolded data unit [0100] of EA) and 535 (e.g., bolded data unit [0010] of EB), respectively. The pseudocode associated with reference number 1.a refers to $EA_i$ and $EB_i$, which is a reference to an ith data unit of each of EA and EB being used for the particular iteration. In this first iteration (e.g., i=1), the $1^{st}$ data unit (e.g., least significant bit) of each of EA and EB is used. Performing the first iteration includes executing pseudocode associated with phases 1 through 5 (e.g., pseudocode associated with reference numbers 1 through 5, respectively) to determine a value of corresponding variables 551, 553, 555, 557, and 559. Performance of each phase of an iteration is described more thoroughly below in relation to a detailed description of FIGS. 6A-6G that illustrates performing the third iteration (e.g., executing the pseudocode for i=3). After performing the first iteration of the pseudocode above, the cells coupled to access lines 504-8 through 504-12 store "0," "0," "0," "0," and "0," associated with 551, 553, 555, 557, and 559, respectively.

FIG. 5C illustrates results after performing a second iteration of greater vector operations on second data units in a second data unit position of 533 (e.g., bolded data unit [0100]) and 535 (e.g., bolded data unit [0010]), respectively. Performing the second iteration includes executing pseudocode associated with phases 1 through 5 (e.g., pseudocode associated with reference numbers 1 through 5, respectively) to determine a value of corresponding variables 551, 553, 555, 557, and 559. After performing the second iteration of the pseudocode above, the cells coupled to access lines 504-8 to 504-12 store bit "0," "1," "0," "0," and "0," associated with 551, 553, 555, 557, and 59, respectively, where the only change is of the value of 553 from a "0" to a "1."

FIG. 5D illustrates results after performing a third iteration of greater vector operations on third data units in a third data unit position of 533 (e.g., bolded data unit [0100]) and 535 (e.g., bolded data unit [0010]), respectively. Performing the third iteration includes executing pseudocode associated with phases 1 through 5 (e.g., pseudocode associated with reference numbers 1 through 5, respectively) to determine a value of corresponding variables 551, 553, 555, 557, and 559. After performing the third iteration of the pseudocode above, the cells coupled to access lines 504-8 to 504-12 store "0," "1," "0," "0," "0," respectively, associated with 551, 553, 555, 557, and 559, respectively, where the 551 changes from "0" to "1," the 553 changes from "1" to "0," the 555 changes from "0" to "1," the 557 changes from "0" to "1," and the 559 changes from "0" to "1."

FIG. 5E illustrates results after performing a fourth iteration of greater vector operations on fourth data units in a fourth data unit position of 533 (e.g., bolded data unit [0100]) and 535 (E.g., [0010]), respectively. Performing the fourth iteration includes executing pseudocode associated with phases 1 through 5 (e.g., pseudocode associated with reference numbers 1 through 5, respectively) to determine a value of corresponding variables 551, 553, 555, 557, and 559. After performing the fourth iteration of the pseudocode above, the cells coupled to access lines 504-8 to 504-12 store "0," "0," "0," "0," "1," "0", respectively, associated with 551, 553, 555, and 559, where 551 changes from "1" to "0," the 553 remains "0," the 555 changes from "1" to "0," the 557 remains "1," and the 559 changes from "1" to "0." Since the elements 533 and 535 are each four (4) data units (e.g., bits) in length, the pseudocode is performed for four iterations. At the conclusion of the final, in this case fourth, iteration, the value stored as 557, a "1" in this example, indicates whether the first element (Element A 533) is greater than the second element (element 535). At the conclusion of the element value comparison operations, a variable 557 of "1" indicates that the first element is greater than the second element, and a variable 557 of "0" indicates that the first element is not greater than the second element. For example, after a final iteration, the value stored as 557 will indicate whether a first element (EA) is greater than a second element (EB), where a "1" indicates the first element is greater than the second and "0" indicates that it is not greater.

Figure 6G:
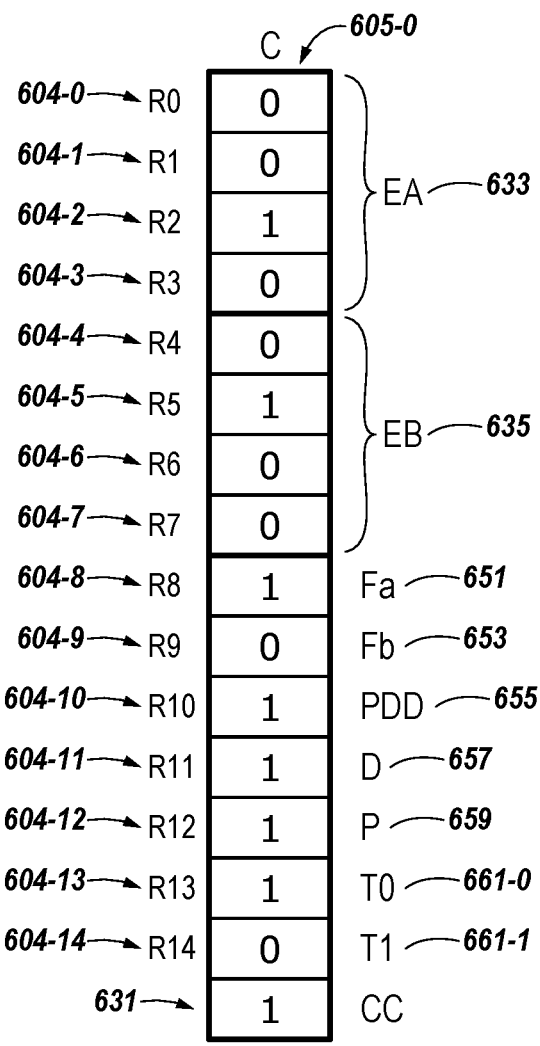

FIGS. 6A-6G each illustrate the state of memory cells of an array at a particular phase associated with performing a greater vector determination in accordance with a number of embodiments of the present disclosure. FIGS. 6A-6G are an illustration of a more detailed description of the third iteration described above in association with FIG. 5D. FIG. 6A is an illustration of a determination of variable 651 ("Fa"), FIG. 6B is an illustration of a determination of variable 553 ("Fb"), FIG. 6C is an illustration of a determination of variable 655 ("PDD"), FIGS. 6D-6F illustrate a determination of variable 657 ("D") and FIG. 6G illustrates a determination of variable 659 ("P").

For purposes of discussion, the below pseudocode is divided into a number of phases associated with determining a variable associated with a particular data unit position of the vectors. The first phase, associated with FIG. 6A, can include execution of pseudocode associated with reference numbers 1.a and 1.b. Likewise, pseudocode associated with a second phase (including pseudocode associated with reference numbers 2.a and 2.b and illustrated in FIG. 6B) can be executed to determine a value of variable 553, pseudocode associated with a third phase (including pseudocode associated with reference numbers 3.a to 3.c and illustrated in FIG. 6C) can be executed to determine a value of variable 555, pseudocode associated with a fourth phase (including pseudocode associated with reference numbers 4.a to 4.e and illustrated by FIGS. 6D-6F) can be executed to determine a value of variable 557, and pseudocode associated with a fifth phase (including pseudocode associated with reference number 5 and illustrated by Figure G) can be executed to update a value of variable 559.

The third iteration is performed on a data unit of each of elements 633 ("EC") and 635 ("ED") in a third data unit position (e.g., "1" for element 533 and "0" for element 535). The pseudocode associated with reference number 1.a to 2.b refers to $EA_i$ and $EB_i$, which is a reference to an ith data unit of each of EA and EB being used for the particular iteration, in this third iteration i=3 and refers to the third data unit (e.g., bit). The third iteration includes performing a number of element value comparison operations in association with the below pseudocode (identical to performing the first, second, and fourth iterations described in FIGS. 5B, 5C, and 5E, respectively).

I. Run Outer Loop for Element Length;
    1.a $EA_i$ AND $EB_i$→T0
    1.b $EA_i$ AND I(tmp 0)→Fa
    2.a $EA_i$ AND $EB_i$→T0
    2.b $EB_i$ AND I(T0)→Fb
    3.a Fa AND Fb→T0
    3.b P AND I(T0)→T0
    3.c Fa OR T0→PDD
    4.a D AND I(PDD)→T0
    4.b PDD AND I(D)→T1
    4.c T0 OR T1→T0
    4.d D AND PDD→T1
    4.e T0 OR T1→D
    5 P=Fa Prior to performing the third iteration of greater vector operations, the bit-vector stored in rows R8 604-8 to R12 604-12 is [01000], which is the result of performing the previous second iteration (associated with FIG. 5C). FIG. 6A illustrates a state of memory cells in association with determining variable 651 ("Fa") during a third iteration of the example associated with FIG. 5D. Reference number 1.a (e.g., "$EA_i$ AND $EB_i$→T0") is associated with performing an AND on a third data unit in a third data unit position from EA 533 (e.g., the bolded "1" of [0100]) and EB 535 (e.g., the bolded "0" of [0010]), and storing the result of "0" in a memory cell coupled to access line 604-13 (e.g., temporary row 0 "T0 661-0). Reference number 1.b (e.g., "A AND I(T0)→Fa"), is associated with performing an AND operation on the third data unit (e.g., "1") of 533 and the inversed T0 data unit (e.g., "0" inversed to equal "1"), resulting in a "1" ("1" ANDed with "1") being stored as variable 651 in a cell coupled to access line 604-8. As an example of how this can be performed, the inverse of T0 (e.g., "1") can be stored into the compute component (CC) 631 and the value in the CC 531 can be ANDed with the third data unit of EA (e.g., "1")

FIG. 6B illustrates a state of memory cells in association with determining 653 during a third iteration of the example associated with FIG. 5D. Reference number 2.a (e.g., "$EA_i$ AND $EB_i$→T0") is associated with performing an AND operation on the third data unit in a third data unit position from 533 and 535, and storing the result "0" in a memory cell of T0 661-0. Reference number 2.b (e.g., "$EB_i$ AND I(T0)") is associated with performing an AND operation on the third data unit of 535 (e.g., data unit "0") and an inverse of the data unit stored in T0 661-0 (e.g., storing the inverse, e.g., "1", of T0 into the CC 631), resulting in "0" ("1" ANDed with "0") being stored as variable 653 in a cell coupled to 604-9.

FIG. 6C illustrates a state of memory cells in association with determining a variable 655 during a third iteration of the example associated with FIG. 5D. 655 refers to a Prior Determination of D, meaning that 655 is a prior determination used to determine 657, as will be described below. Reference number 3.a (e.g., "Fa AND Fb→T0") is associated with performing an AND operation on the variable 651 ("1" stored in a cell coupled to 605-0) and the variable 653 ("0" stored in a cell coupled to 605-1), resulting in a "0" being stored in T0 661-0. Reference number 3.b (e.g., "P AND I(T0)→T0") is associated with performing an AND operation on the variable 659 (e.g., "0" stored in a cell coupled to 605-4) and an inverse of the value T0 661-0 (e.g., "0" inversed to equal "1" by transferring the inverse of T0 to CC 631), resulting in a "0" (P of "0" ANDed with inverse of T0 "1") being stored as T0 661-0. Reference number 3.c (e.g., "Fa OR T0→PDD") is associated with performing an OR operation on the variable 651 (e.g., "1") and the T0 661-0 (e.g., "0"), and storing the result of "1" (e.g., "0" ORed with "1") as the 655, as illustrated in FIG. 6C.

While the above example illustrates a single column including two elements being compared, examples are not so limited. For instance, a number of pairs of elements can be stored in other columns and each of the operations (e.g., logical operations) discussed can be performed in parallel on respective element pairs on a per column basis. As an example, performing an OR operation can include performing an OR operation on a first bit-vector "a" (e.g., [$a_0$ $a_1$ $a_2$ $a_3$ $a_4$ $a_5$ $a_6$ $a_7$]) and a second bit-vector "b" (e.g., [$b_0$ $b_1$ $b_2$ $b_3$ $b_4$ $b_5$ $b_6$ $b_7$]). Performing an OR operation on "a" and "b" results in a bit-vector "c" (e.g., [$c_0$ $c_1$ $c_2$ $c_3$ $c_4$ $c_5$]), wherein $c_0=a_0$ OR $b_0$, $c_1=a_1$ OR $b_1$, $c_2=a_2$ OR $b_2$, $c_3=a_3$ OR $b_3$, $c_4=a_4$ OR $b_4$, $c_5=a_5$, $c_6=a_6$ OR $b_6$, $c_7=a_7$ OR $b_7$, OR $b_7$. In the present example, the data unit of Fa would correspond to $a_0$ and the data unit of T0 would correspond to $b_0$, while subsequent columns of stored pairs of elements (e.g., stored in columns of sense line 405-1, 405-2, 405-3, etc. illustrated in FIG. 4) would have data units stored in cells coupled to a same access line as the cell storing Fa and T0 (e.g., 604-8 and 604-13, respectively).

FIGS. 6D-6F illustrate a state of memory cells in association with determining a variable 657. For ease of illustration, the determination of variable 657 is illustrated in more than one figure to more fully describe the determination. FIG. 6D is associated with reference numbers 4.a to 4.b of the pseudocode described above, FIG. 6E is associated with reference numbers 4.c to 4.d, and FIG. 6F is associated with reference number 4.e. Referring to FIG. 6D, reference number 4.a (e.g., "D AND I(PDD)→T0") is associated with performing an AND operation on variable 657 (e.g., "0")) and an inverse of variable 655 (e.g., an inverse of "1," resulting in "0"). The result of the AND operation (e.g., "0") is stored as T0 661-0. Reference number 4.b (e.g., "PDD AND I(D)→T1") is associated with performing an AND operation on variable 655 (e.g., "1") and an inverse of variable 657 (e.g., inverse of "0" resulting in a "1", performed by transferring the inverse of 657 into the CC 631, as illustrated in FIG. 6D), resulting in a "1" (e.g., "1" ANDed with "1") being stored in T1 661-1.

Referring to FIG. 6E, reference number 4.c (e.g., "T0 OR T1→T0") is associated with performing an OR operation on 661-0 (e.g., "0" as illustrated previously in FIG. 6D) and 661-1 (e.g., "1" as illustrated previously in FIG. 6D). The result of the OR operation (e.g., "1" from ORing "0" and "1") is stored as 661-0. Reference number 4.d (e.g., "D AND PDD→T1") is associated with performing an AND operation on 657 (e.g., "0") and 655 (e.g., 1"), resulting in a "0" (e.g., "0" ANDed with "1") being stored as 661-1, as illustrated in FIG. 6E.

Referring to FIG. 6F, reference number 4.e (e.g., "T0 OR T1→D") is associated with performing an OR operation on 661-0 (e.g., "1") and T1 661-1 (e.g., "0"), resulting in a "1" being stored as 657, as illustrated in FIG. 6F. FIG. 6G is associated with determining a value of variable 659 for the next iteration. Referring to FIG. 6G, reference number 5 (e.g., "P=Fa") is associated with storing the current value of 651 (e.g., "1") as an updated 659, as illustrated by a value of P being "1." At the conclusion of the third iteration, the bit-vector stored in cells coupled to access lines 604-8 to 604-12 is now [10111], as illustrated at FIG. 5D. The fourth iteration, illustrated in FIG. 5E, concludes with a value of 657 of "1" which indicates that element 533 (e.g., ([0100]), numerical value of "4") is greater than element 535 (e.g., [0010], numerical value of "2"). In the instance that the value of 557 was "0" at the conclusion of the final, in this case fourth, iteration, the value of a first element (533/633) would be indicated as not greater than the value of a second element (535/635), which is not the case in this example as the value of 557 is "1." Further, after a final iteration, the value stored as 557 will indicate whether a first element (EA) is greater than a second element (EB), where a "1" indicates the first element is greater than the second and "0" indicates that it is not greater.

In this way, a determination of which vector (e.g., single element vector in this example) is greater can be performed on elements stored in cells coupled to a same sense line and a plurality of access lines (e.g., illustrated as vertical in FIGS. 5A-6G) by using fewer groups of cells that are coupled to a same access line and a plurality of sense lines (e.g., what would be illustrated as horizontal cells in FIG. 4, or referred to as a "row"). This can be advantageous when vectors are stored in cells coupled to a same sense line because "rows" of cells may be limited.

Figure 7:
FIG. 7 is a logic table illustrating selectable logic operation results implemented by a sensing circuitry in accordance with a number of embodiments of the present disclosure.

FIG. 7 is a logic table illustrating selectable logic operation results implemented by a sensing circuitry (e.g., sensing circuitry 250 shown in FIG. 2) in accordance with a number of embodiments of the present disclosure. The four logic selection control signals (e.g., TF, TT, FT, and FF), in conjunction with a particular data value present on the complementary sense lines, can be used to select one of a plurality of logical operations to implement involving the starting data values stored in the sense amplifier 206 and compute component 231. The four control signals (e.g., TF, TT, FT, and FF), in conjunction with a particular data value present on the complementary sense lines (e.g., on nodes S and S*), controls the pass gates 307-1 and 307-2 and swap transistors 342, which in turn affects the data value in the compute component 331 and/or sense amplifier 306 before/after firing. The capability to selectably control the swap transistors 342 facilitates implementing logical operations involving inverse data values (e.g., inverse operands and/or inverse result), among others.

Logic Table 7-1 illustrated in FIG. 7 shows the starting data value stored in the compute component 231 shown in column A at 744, and the starting data value stored in the sense amplifier 206 shown in column B at 745. The other 3 column headings in Logic Table 7-1 refer to the state of the pass gates 207-1 and 207-2 and the swap transistors 242, which can respectively be controlled to be OPEN or CLOSED depending on the state of the four logic selection control signals (e.g., TF, TT, FT, and FF), in conjunction with a particular data value present on the pair of complementary sense lines 205-1 and 205-2 when the ISO control signal is asserted. The "NOT OPEN" column corresponds to the pass gates 207-1 and 207-2 and the swap transistors 242 both being in a non-conducting condition, the "OPEN TRUE" column corresponds to the pass gates 207-1 and 207-2 being in a conducting condition, and the "OPEN INVERT" column corresponds to the swap transistors 242 being in a conducting condition. The configuration corresponding to the pass gates 207-1 and 207-2 and the swap transistors 242 both being in a conducting condition is not reflected in Logic Table 7-1 since this results in the sense lines being shorted together.

Via selective control of the pass gates 207-1 and 207-2 and the swap transistors 242, each of the three columns of the upper portion of Logic Table 7-1 can be combined with each of the three columns of the lower portion of Logic Table 7-1 to provide nine (e.g., 3×3) different result combinations, corresponding to nine different logical operations, as indicated by the various connecting paths shown at 775. The nine different selectable logical operations that can be implemented by the sensing circuitry 250 are summarized in Logic Table 7-2.

The columns of Logic Table 7-2 show a heading 780 that includes the states of logic selection control signals (e.g., FF, FT, TF, TT). For example, the state of a first logic selection control signal (e.g., FF) is provided in row 776, the state of a second logic selection control signal (e.g., FT) is provided in row 777, the state of a third logic selection control signal (e.g., TF) is provided in row 778, and the state of a fourth logic selection control signal (e.g., TT) is provided in row 779. The particular logical operation corresponding to the results is summarized in row 747.

FIG. 8 illustrates a timing diagram associated with performing a logical AND operation and a shifting operation using the sensing circuitry in accordance with a number of embodiments of the present disclosure. FIG. 8 includes waveforms corresponding to signals EQ, ROW X, ROW Y, SENSE AMP, TF, TT, FT, FF, PHASE 1R, PHASE 2R, PHASE 1L, PHASE 2L, ISO, Pass, Pass*, DIGIT, and DIGIT_. The EQ signal corresponds to an equilibrate signal associated with a sense amplifier (e.g., EQ 226 shown in FIG. 2). The ROW X and ROW Y signals correspond to signals applied to respective access line (e.g., access lines 204-X and 204-Y shown in FIG. 2) to access a selected cell (or row of cells). The SENSE AMP signal corresponds to a signal used to enable/disable a sense amplifier (e.g., sense amplifier 306). The TF, TT, FT, and FF signals correspond to logic selection control signals such as those shown in FIG. 3 (e.g., signals coupled to logic selection transistors 362, 3452, 354, and 364). The PHASE 1R, PHASE 2R, PHASE 1L, and PHASE 2L signals correspond to the control signals (e.g., clock signals) provided to respective control lines 382, 383, 391 and 392 shown in FIG. 3. The ISO signal corresponds to the signal coupled to the gates of the isolation transistors 350-1 and 350-2 shown in FIG. 3. The PASS signal corresponds to the signal coupled to the gates of pass transistors 307-1 and 307-2 shown in FIG. 3, and the PASS* signal corresponds to the signal coupled to the gates of the swap transistors 342. The DIGIT and DIGIT_ signals correspond to the signals present on the respective sense lines 305-1 (e.g., DIGIT (n)) and 305-2 (e.g., DIGIT (n)_).

The timing diagram shown in FIG. 8 is associated with performing a logical AND operation on a data value stored in a first memory cell and a data value stored in a second memory cell of an array. The memory cells can correspond to a particular column of an array (e.g., a column comprising a complementary pair of sense lines) and can be coupled to respective access lines (e.g., ROW X and ROW Y). In describing the logical AND operation shown in FIG. 8, reference will be made to the sensing circuitry described in FIG. 3. For example, the logical operation described in FIG. 8 can include storing the data value of the ROW X memory cell (e.g., the "ROW X data value) in the latch of the corresponding compute component 331 (e.g., the "A" data value), which can be referred to as the accumulator 331, storing the data value of the ROW Y memory cell (e.g., the "ROW Y data value") in the latch of the corresponding sense amplifier 306 (e.g., the "B" data value), and performing a selected logical operation (e.g., a logical AND operation in this example) on the ROW X data value and the ROW Y data value, with the result of the selected logical operation being stored in the latch of the compute component 331.

As shown in FIG. 8, at time $T_1$, equilibration of the sense amplifier 306 is disabled (e.g., EQ goes low). At time $T_2$, ROW X goes high to access (e.g., select) the ROW X memory cell. At time $T_3$, the sense amplifier 306 is enabled (e.g., SENSE AMP goes high), which drives the complementary sense lines 305-1 and 305-2 to the appropriate rail voltages (e.g., VDD and GND) responsive to the ROW X data value (e.g., as shown by the DIGIT and DIGIT_ signals), and the ROW X data value is latched in the sense amplifier 306. At time $T_4$, the PHASE 2R and PHASE 2L signals go low, which disables feedback on the latch of the compute component 331 (e.g., by turning off transistors 386 and 390, respectively) such that the value stored in the compute component may be overwritten during the logical operation. Also, at time $T_4$, ISO goes low, which disables isolation transistors 350-1 and 350-2. At time $T_5$, TT and FT are enabled (e.g., go high), which results in PASS going high (e.g., since either transistor 352 or 354 will conduct depending on which of node ST2 (corresponding to node "S" in FIG. 2) or node SF2 (corresponding to node "S*" in FIG. 2) was high when ISO was disabled at time $T_4$ (recall that when ISO is disabled, the voltages of the nodes ST2 and SF2 reside dynamically on the gates of the respective enable transistors 352 and 354). PASS going high enables the pass transistors 307-1 and 307-2 such that the DIGIT and DIGIT_ signals, which correspond to the ROW X data value, are provided to the respective compute component nodes ST2 and SF2. At time $T_6$, TT and FT are disabled, which results in PASS going low, which disables the pass transistors 307-1 and 307-2. It is noted that PASS* remains low between time $T_5$ and $T_6$ since the TF and FF signals remain low. At time $T_7$, ROW X is disabled, and PHASE 2R, PHASE 2L, and ISO are enabled. Enabling PHASE 2R and PHASE 2L at time $T_7$ enables feedback on the latch of the compute component 331 such that the ROW X data value is latched therein. Enabling ISO at time $T_7$ again couples nodes ST2 and SF2 to the gates of the enable transistors 352, 354, 362, and 364. At time $T_8$, equilibration is enabled (e.g., EQ goes high such that DIGIT and DIGIT_ are driven to an equilibrate voltage such as VDD/2) and the sense amplifier 306 is disabled (e.g., SENSE AMP goes low).

With the ROW X data value latched in the compute component 331, equilibration is disabled (e.g., EQ goes low at time $T_9$). At time $T_{10}$, ROW Y goes high to access (e.g., select) the ROW Y memory cell. At time $T_{11}$, the sense amplifier 306 is enabled (e.g., SENSE AMP goes high), which drives the complementary sense lines 305-1 and 305-2 to the appropriate rail voltages (e.g., VDD and GND) responsive to the ROW Y data value (e.g., as shown by the DIGIT and DIGIT_ signals), and the ROW Y data value is latched in the sense amplifier 306. At time $T_{12}$, the PHASE 2R and PHASE 2L signals go low, which disables feedback on the latch of the compute component 331 (e.g., by turning off transistors 386 and 390, respectively) such that the value stored in the compute component may be overwritten during the logical operation. Also, at time $T_{12}$, ISO goes low, which disables isolation transistors 350-1 and 350-2. Since the desired logical operation in this example is an AND operation, at time $T_{13}$, TT is enabled while TF, FT and FF remain disabled (as shown in TABLE 7-2, FF=0, FT=0, TF=0, and TT=1 corresponds to a logical AND operation). Whether enabling TT results in PASS going high depends on the value stored in the compute component 331 when ISO is disabled at time $T_{12}$. For example, enable transistor 352 will conduct if node ST2 was high when ISO is disabled, and enable transistor will not conduct if node ST2 was low when ISO was disabled at time $T_{12}$.

In this example, if PASS goes high at time $T_{13}$, the pass transistors 307-1 and 307-2 are enabled such that the DIGIT and DIGIT_ signals, which correspond to the ROW Y data value, are provided to the respective compute component nodes ST2 and SF2. As such, the value stored in the compute component 331 (e.g., the ROW X data value) may be flipped, depending on the value of DIGIT and DIGIT_ (e.g., the ROW Y data value). In this example, if PASS stays low at time $T_{13}$, the pass transistors 307-1 and 307-2 are not enabled such that the DIGIT and DIGIT_ signals, which correspond to the ROW Y data value, remain isolated from the nodes ST2 and SF2 of the compute component 331. As such, the data value in the compute component (e.g., the ROW X data value) would remain the same.

At time $T_{14}$, TT is disabled, which results in PASS going (or remaining) low, such that the pass transistors 307-1 and 307-2 are disabled. It is noted that PASS* remains low between time $T_{13}$ and $T_{14}$ since the TF and FF signals remain low. At time $T_{15}$, ROW Y is disabled, and PHASE 2R, PHASE 2L, and ISO are enabled. Enabling PHASE 2R and PHASE 2L at time $T_{15}$ enables feedback on the latch of the compute component 331 such that the result of the AND operation (e.g., "A" AND "B") is latched therein. Enabling ISO at time $T_{15}$ again couples nodes ST2 and SF2 to the gates of the enable transistors 352, 354, 362, and 364. At time $T_{16}$, equilibration is enabled (e.g., EQ goes high such that DIGIT and DIGIT_ are driven to an equilibrate voltage) and the sense amplifier 306 is disabled (e.g., SENSE AMP goes low).

The result of the AND operation, which is initially stored in the compute component 331 in this example, can be transferred back to the memory array (e.g., to a memory cell coupled to ROW X, ROW Y, and/or a different row via the complementary sense lines) and/or to an external location (e.g., an external processing component) via I/O lines.

FIG. 8 also includes (e.g., at 801) signaling associated with shifting data (e.g., from a compute component 331 to an adjacent compute component 331). The example shown in FIG. 8 illustrates two left shifts such that a data value stored in a compute component corresponding to column "N" is shifted left to a compute component corresponding to column "N–2". As shown at time $T_{16}$, PHASE 2R and PHASE 2L are disabled, which disables feedback on the compute component latches, as described above. To perform a first left shift, PHASE 1L is enabled at time $T_{17}$ and disabled at time $T_{18}$. Enabling PHASE 1L causes transistor 389 to conduct, which causes the data value at node SF1 to move left to node SF2 of a left-adjacent compute component 331. PHASE 2L is subsequently enabled at time $T_{19}$ and disabled at time $T_{20}$. Enabling PHASE 2L causes transistor 390 to conduct, which causes the data value from node ST1 to move left to node ST2 completing a left shift.

The above sequence (e.g., enabling/disabling PHASE 1L and subsequently enabling/disabling PHASE 2L) can be repeated to achieve a desired number of left shifts. For instance, in this example, a second left shift is performed by enabling PHASE 1L at time $T_{21}$ and disabling PHASE 1L at time $T_{22}$. PHASE 2L is subsequently enabled at time $T_{23}$ to complete the second left shift. Subsequent to the second left shift, PHASE 2L remains enabled and PHASE 2R is enabled (e.g., at time $T_{24}$) such that feedback is enabled to latch the data values in the compute component latches.

FIG. 9 illustrates a timing diagram associated with performing a logical XOR operation and a shifting operation using the sensing circuitry in accordance with a number of embodiments of the present disclosure. FIG. 9 includes the same waveforms described in FIG. 8 above. However, the timing diagram shown in FIG. 9 is associated with performing a logical XOR operation on a ROW X data value and a ROW Y data value (e.g., as opposed to a logical AND operation). Reference will again be made to the sensing circuitry described in FIG. 3.

The signaling indicated at times $T_0$ through $T_9$ for FIG. 9 are the same as for FIG. 8 and will not be repeated here. As such, at time $T_9$, EQ is disabled with the ROW X data value being latched in the compute component 331. At time $T_{10}$, ROW Y goes high to access (e.g., select) the ROW Y memory cell. At time $T_{11}$, the sense amplifier 306 is enabled (e.g., SENSE AMP goes high), which drives the complementary sense lines 305-1 and 305-2 to the appropriate rail voltages (e.g., VDD and GND) responsive to the ROW Y data value (e.g., as shown by the DIGIT and DIGIT_ signals), and the ROW Y data value is latched in the sense amplifier 306. At time $T_{12}$, the PHASE 2R and PHASE 2L signals go low, which disables feedback on the latch of the compute component 1431 (e.g., by turning off transistors 386 and 390, respectively) such that the value stored in the compute component 331 may be overwritten during the logical operation. Also, at time $T_{12}$, ISO goes low, which disables isolation transistors 350-1 and 350-2. Since the desired logical operation in this example is an XOR operation, at time $T_{13}$, TF and FT are enabled while TT and FF remain disabled (as shown in TABLE 7-2, FF=0, FT=1, TF=1, and TT=0 corresponds to a logical XOR (e.g., "AXB") operation). Whether enabling TF and FT results in PASS or PASS* going high depends on the value stored in the compute component 331 when ISO is disabled at time $T_{12}$. For example, enable transistor 362 will conduct if node ST2 was high when ISO is disabled, and enable transistor 362 will not conduct if node ST2 was low when ISO was disabled at time $T_{12}$. Similarly, enable transistor 354 will conduct if node SF2 was high when ISO is disabled, and enable transistor 354 will not conduct if node SF2 was low when ISO is disabled.

In this example, if PASS goes high at time $T_{13}$, the pass transistors 307-1 and 307-2 are enabled such that the DIGIT and DIGIT_ signals, which correspond to the ROW Y data value, are provided to the respective compute component nodes ST2 and SF2. As such, the value stored in the compute component 331 (e.g., the ROW X data value) may be flipped, depending on the value of DIGIT and DIGIT_ (e.g., the ROW Y data value). In this example, if PASS stays low at time $T_{13}$, the pass transistors 307-1 and 307-2 are not enabled such that the DIGIT and DIGIT_ signals, which correspond to the ROW Y data value, remain isolated from the nodes ST2 and SF2 of the compute component 331. As such, the data value in the compute component (e.g., the ROW X data value) would remain the same. In this example, if PASS* goes high at time $T_{13}$, the swap transistors 342 are enabled such that the DIGIT and DIGIT_ signals, which correspond to the ROW Y data value, are provided to the respective compute component nodes ST2 and SF2 in a transposed manner (e.g., the "true" data value on DIGIT(n) would be provided to node SF2 and the "complement" data value on DIGIT(n)_would be provided to node ST2). As such, the value stored in the compute component 331 (e.g., the ROW X data value) may be flipped, depending on the value of DIGIT and DIGIT_ (e.g., the ROW Y data value). In this example, if PASS* stays low at time $T_{13}$, the swap transistors 342 are not enabled such that the DIGIT and DIGIT_ signals, which correspond to the ROW Y data value, remain isolated from the nodes ST2 and SF2 of the compute component 331. As such, the data value in the compute component (e.g., the ROW X data value) would remain the same.

At time $T_{14}$, TF and FT are disabled, which results in PASS and PASS* going (or remaining) low, such that the pass transistors 307-1 and 307-2 and swap transistors 342 are disabled. At time $T_{15}$, ROW Y is disabled, and PHASE 2R, PHASE 2L, and ISO are enabled. Enabling PHASE 2R and PHASE 2L at time $T_{15}$ enables feedback on the latch of the compute component 331 such that the result of the XOR operation (e.g., "A" XOR "B") is latched therein. Enabling ISO at time $T_{15}$ again couples nodes ST2 and SF2 to the gates of the enable transistors 352, 354, 362, and 364. At time $T_{16}$, equilibration is enabled (e.g., EQ goes high such that DIGIT and DIGIT_ are driven to an equilibrate voltage) and the sense amplifier 306 is disabled (e.g., SENSE AMP goes low).

The result of the XOR operation, which is initially stored in the compute component 331 in this example, can be transferred back to the memory array (e.g., to a memory cell coupled to ROW X, ROW Y, and/or a different row via the complementary sense lines) and/or to an external location (e.g., an external processing component) via I/O lines.

FIG. 9 also includes (e.g., at 901) signaling associated with shifting data (e.g., from a compute component 331 to an adjacent compute component 331). The example shown in FIG. 9 illustrates two right shifts such that a data value stored in a compute component corresponding to column "N" is shifted right to a compute component corresponding to column "N+2". As shown at time $T_{16}$, PHASE 2R and PHASE 2L are disabled, which disables feedback on the compute component latches, as described above. To perform a first right shift, PHASE 1R is enabled at time $T_{17}$ and disabled at time $T_{18}$. Enabling PHASE 1R causes transistor 381 to conduct, which causes the data value at node ST1 to move right to node ST2 of a right-adjacent compute component 331. PHASE 2R is subsequently enabled at time $T_{19}$ and disabled at time $T_{20}$. Enabling PHASE 2R causes transistor 386 to conduct, which causes the data value from node SF1 to move right to node SF2 completing a right shift.

The above sequence (e.g., enabling/disabling PHASE 1R and subsequently enabling/disabling PHASE 2R) can be repeated to achieve a desired number of right shifts. For instance, in this example, a second right shift is performed by enabling PHASE 1R at time $T_{21}$ and disabling PHASE 1R at time $T_{22}$. PHASE 2R is subsequently enabled at time $T_{23}$ to complete the second right shift. Subsequent to the second right shift, PHASE 1R remains disabled, PHASE 2R remains enabled, and PHASE 2L is enabled (e.g., at time $T_{24}$) such that feedback is enabled to latch the data values in the compute component latches.

Although the examples described in FIGS. 8 and 9 include the logical operation result being stored in the compute component (e.g., 331), sensing circuitry in accordance with embodiments described herein can be operated to perform logical operations with the result being initially stored in the sense amplifier (e.g., as illustrated in FIG. 8). Also, embodiments are not limited to the "AND" and "XOR" logical operation examples described in FIGS. 8 and 9, respectively. For example, sensing circuitry in accordance with embodiments of the present disclosure (e.g., 350 shown in FIG. 3) can be controlled to perform various other logical operations such as those shown in Table 7-2.

While example embodiments including various combinations and configurations of sensing circuitry, sense amps, compute components, dynamic latches, isolation devices, and/or shift circuitry have been illustrated and described herein, embodiments of the present disclosure are not limited to those combinations explicitly recited herein. Other combinations and configurations of the sensing circuitry, sense amps, compute component, dynamic latches, isolation devices, and/or shift circuitry disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
 a first group of memory cells coupled to a sense line and to a number of first access lines;
 a second group of memory cells coupled to the sense line and to a number of second access lines; and
 a controller configured to operate sensing circuitry to compare a value of a first element stored in the first group of memory cells to a value of a second element stored in the second group of memory cells to determine which of the value of the first element and the value of the second element is greater;
 wherein the comparison comprises comparing the value of the first element to the value of the second element on a bit-by-bit basis.

2. The apparatus of claim 1, wherein the controller configured to operate the sensing circuitry to perform the number of operations comprises the controller configured to operate sensing circuitry to perform at least one of a number of AND operations, OR operations, and INVERT operations without performing a sense line address access.

3. The apparatus of claim 2, wherein the sensing circuitry comprises a number of sense amplifiers and a number of compute components.

4. The apparatus of claim 3, wherein each of the number of compute components comprises a number of transistors formed on pitch with memory cells corresponding to a particular one of a number of columns of memory cells.

5. The apparatus of claim 1, wherein a data value that indicates whether the value of the first element is greater than the second element is stored in a memory cell coupled to a second sense line and an access line other than the number of first access lines and other than the number of second access lines.

6. A method for performing an element comparison, comprising:
performing, using sensing circuitry, an element comparison operation on:
a first element stored in a first group of memory cells coupled to a sense line and to a first number of access lines of a memory array; and
a second element stored in a second group of memory cells coupled to the sense line and to a number of second access lines of the memory array; and
determining whether a value of the first element is greater than a value of the second element;
wherein performing the element comparison operation comprises comparing a data unit in a first data unit position of the first element to a data unit in the first data unit position of the second element.

7. The method of claim 6, wherein comparing the data units comprises comparing a least significant data unit of the first element to a least significant data unit of the second element.

8. The method of claim 6, wherein performing the element comparison operation comprises comparing each data unit of the first element in a respective data unit position to a data unit in a same respective data unit position of the second element.

9. An apparatus comprising:
a first group of memory cells coupled to a number of sense lines and to a number of first access lines;
a second group of memory cells coupled to the number of sense lines and to a number of second access lines; and
a controller configured to:
perform, using sensing circuitry, a plurality of greater vector determination operations, in parallel, by comparing a plurality of first elements stored as bit-vectors in the first group of memory cells to a plurality of second elements stored as bit-vectors in the second group of memory cells; and
cause a plurality of results of the respective plurality of greater vector determination operations to be stored in a third group of memory cells coupled to a number of third access lines.

10. The apparatus of claim 9, wherein the controller is configured to use sensing circuitry to compare each of the plurality of first elements stored in memory cells coupled to a particular sense line to a respective one of the plurality of second elements that are stored in memory cells coupled to a same particular sense line.

11. The apparatus of claim 9, wherein the controller is configured to use sensing circuitry to compare a first of the plurality of first elements to a first of the plurality of second elements, and wherein:
the first of the plurality of first elements is stored in memory cells coupled to a first of the number of sense lines and to a first group of the number of first access lines; and
the first of the plurality of second elements is in memory cells coupled to the first of the number of sense lines and to a first group of the number of second access lines.

12. The apparatus of claim 11, wherein the controller is configured to use sensing circuitry to compare a second of the plurality of first elements to a second of the plurality of second elements, and wherein:
the second of the plurality of first elements is stored in memory cells coupled to a second of the number of sense lines and to the first group of the number of first access lines; and
the second of the plurality of second elements is in memory cells coupled to the second of the number of sense lines and to the first group of the number of second access lines.

13. The apparatus of claim 9, wherein the controller is further configured to use sensing circuitry to compare a plurality of first elements to a plurality of second elements by:
performing an AND operation on:
a particular data unit of one of the plurality of first elements; and
an inverse of a result of performing an AND operation on the particular data unit of the one of the plurality of first elements and a particular data unit of one of the plurality of second elements.

14. The apparatus of claim 13, wherein the controller is further configured to use sensing circuitry to compare a plurality of first elements to a plurality of second elements by:
performing an AND operation on:
the particular data unit of the one of the plurality of second elements; and
an inverse of a result of performing an AND operation on the particular data unit of the one of the plurality of first elements and the particular data unit of one of the plurality of second elements.

15. A method for performing an element comparison comprising:
performing a plurality of greater vector operations in parallel on:
a plurality (M) of first elements stored in a first group of memory cells coupled to a number of sense lines and to a number of first access lines; and
a plurality (M) of second elements stored in a second group of memory cells coupled to the number of sense lines and to a number of second access lines;
wherein the plurality of greater vector operations are performed by performing a number of operations; and
storing, in parallel, a plurality of results of the greater vector operations in a third group of memory cells coupled to the number of sense lines and to a number of third access lines.

16. The method of claim 15, wherein performing the number of operations comprises performing at least one of a number of AND operations, OR operations, and SHIFT operations without performing a sense line address access.

17. The method of claim 15, wherein the plurality of results each indicate whether a value of one of the plurality of first elements is greater than a value of one of the plurality of second elements.

18. The method of claim 17, wherein the plurality of results are each associated with a comparison of an element of the plurality of first elements stored in memory cells coupled to a particular sense line and an element of the plurality of second elements stored in memory cells coupled to the particular sense line.

19. The method of claim 1, wherein each of the plurality of first elements includes N bits and each of the plurality of second elements includes N bits.

20. The method of claim 19, wherein:
each of the N bits of the M first elements and the N bits of the M second elements are associated with an index of N number of indexes; and
the greater vector operations are performed on a bit of an element of the M first elements with a particular index and on a bit of an element of the M second elements with the particular index.

21. The method of claim 20, further comprising performing the greater vector operations on a bit-by-bit basis, wherein a number of iterations of performing the greater vector operations is equal to N.

\* \* \* \* \*